United States Patent
Thacker et al.

(10) Patent No.: US 7,348,786 B2
(45) Date of Patent: Mar. 25, 2008

(54) PROBE MODULE FOR TESTING CHIPS WITH ELECTRICAL AND OPTICAL INPUT/OUTPUT INTERCONNECTS, METHODS OF USE, AND METHODS OF FABRICATION

(75) Inventors: Hiren D. Thacker, Atlanta, GA (US); Oluwafemi O. Ogunsola, Atlanta, GA (US); James D. Meindl, Marietta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 45 days.

(21) Appl. No.: 11/216,645

(22) Filed: Aug. 31, 2005

(65) Prior Publication Data

US 2006/0109015 A1    May 25, 2006

Related U.S. Application Data

(60) Provisional application No. 60/605,871, filed on Aug. 31, 2004.

(51) Int. Cl.
- *G01R 31/02* (2006.01)
- *G01R 31/302* (2006.01)
- *G01R 31/308* (2006.01)

(52) U.S. Cl. .............. 324/754; 324/752; 324/753
(58) Field of Classification Search .............. 324/754, 324/149, 752, 750, 158.1
See application file for complete search history.

(56) References Cited

U.S. PATENT DOCUMENTS

| | | | |
|---|---|---|---|
| 4,315,584 A | 2/1982 | Wuestner | 225/2 |
| 4,420,873 A | 12/1983 | Leonberger et al. | 29/576 |
| 4,458,476 A | 7/1984 | Mayr et al. | 57/294 |
| 4,518,219 A | 5/1985 | Leonberger et al. | 350/96.12 |
| 4,567,433 A * | 1/1986 | Ohkubo et al. | 324/762 |
| 4,652,083 A | 3/1987 | Laakmann | 350/96.32 |
| 4,688,892 A | 8/1987 | Laakmann | 350/96.32 |
| 4,688,893 A | 8/1987 | Laakmann | 350/96.32 |
| 4,775,640 A | 10/1988 | Chan | 437/8 |
| 4,791,363 A * | 12/1988 | Logan | 324/754 |
| 4,808,815 A * | 2/1989 | Langley | 250/227.28 |
| 4,979,787 A | 12/1990 | Lichtenberger | 350/96.2 |
| 5,026,142 A | 6/1991 | Worrell et al. | 350/96.32 |
| 5,082,369 A | 1/1992 | Kennon et al. | 356/243 |
| 5,101,453 A | 3/1992 | Rumbaugh | 385/12 |
| 5,125,050 A | 6/1992 | Deri | 385/11 |
| 5,131,060 A | 7/1992 | Sakata | 385/2 |
| 5,177,555 A | 1/1993 | Stratton et al. | 356/35.5 |
| 5,189,363 A | 2/1993 | Bregman et al. | 324/158 |
| 5,208,531 A | 5/1993 | Aton | 324/158 |
| 5,268,066 A | 12/1993 | Tabasky et al. | 156/633 |
| 5,276,761 A | 1/1994 | Shimoyama et al. | 385/125 |
| 5,317,256 A | 5/1994 | Williamson | 324/158 |
| 5,357,593 A | 10/1994 | Bossler | 385/49 |
| 5,412,330 A | 5/1995 | Ravel et al. | 324/753 |

(Continued)

*Primary Examiner*—Vinh Nguyen
*Assistant Examiner*—Joshua Benitez
(74) *Attorney, Agent, or Firm*—Thomas, Kayden, Horstemeyer & Risley, LLP

(57) ABSTRACT

Probe modules, methods of use of probe modules, and methods of preparing probe modules, are disclosed. A representative embodiment of a probe module, among others, includes a redistribution substrate and a probe substrate interfaced with the redistribution substrate. The probe substrate is operative to test at least one signal of at least one optoelectronic device under test. The probe substrate is operative to interface with electrical and optical components.

26 Claims, 19 Drawing Sheets

U.S. PATENT DOCUMENTS

| | | | |
|---|---|---|---|
| 5,432,878 A | 7/1995 | Smous | 385/52 |
| 5,481,633 A | 1/1996 | Mayer | 385/49 |
| 5,513,288 A | 4/1996 | Mayer | 385/30 |
| 5,557,214 A | 9/1996 | Barnett | 324/762 |
| 5,568,574 A | 10/1996 | Tanguay, Jr. et al. | 385/14 |
| 5,625,298 A | 4/1997 | Hirano et al. | 324/754 |
| 5,656,942 A | 8/1997 | Watts et al. | 324/754 |
| 5,723,347 A | 3/1998 | Hirano et al. | 437/8 |
| 5,729,646 A | 3/1998 | Miyagi et al. | 385/125 |
| 5,737,458 A | 4/1998 | Wojnarowski et al. | 385/15 |
| 5,761,350 A | 6/1998 | Koh | 385/14 |
| 5,804,314 A | 9/1998 | Field et al. | 428/402 |
| 5,897,728 A | 4/1999 | Cole et al. | 156/155 |
| 5,930,588 A | 7/1999 | Paniccia | 438/16 |
| 5,969,821 A | 10/1999 | Muramatsu et al. | 356/376 |
| 5,982,187 A * | 11/1999 | Tarzwell | 324/756 |
| 6,049,639 A | 4/2000 | Paniccia et al. | 385/14 |
| 6,052,197 A | 4/2000 | Drake | 356/445 |
| 6,108,074 A | 8/2000 | Bloom | 356/73.1 |
| 6,137,303 A | 10/2000 | Deckert et al. | 324/76.5 |
| 6,151,155 A | 11/2000 | Durfee, III et al. | 359/332 |
| 6,156,216 A | 12/2000 | Manalis et al. | 216/11 |
| 6,185,357 B1 | 2/2001 | Zou et al. | 385/133 |
| 6,237,370 B1 | 5/2001 | Bloom | 54/484 |
| 6,249,621 B1 | 6/2001 | Sargent, IV et al. | 385/24 |
| 6,250,819 B1 | 6/2001 | Porte et al. | 385/88 |
| 6,259,832 B1 | 7/2001 | Robertsson | 385/14 |
| 6,324,316 B1 | 11/2001 | Fouquet et al. | 385/16 |
| 6,384,612 B2 * | 5/2002 | Freund et al. | 324/750 |
| 6,404,949 B1 | 6/2002 | Sargent, IV et al. | 385/24 |
| 6,429,671 B1 * | 8/2002 | Duckworth et al. | 324/758 |
| 6,448,547 B1 | 9/2002 | Johnson | 250/214 |
| 6,448,805 B1 | 9/2002 | Heald et al. | 324/767 |
| 6,477,285 B1 | 11/2002 | Shanley | 385/14 |
| 6,480,643 B1 | 11/2002 | Allman et al. | 385/14 |
| 6,493,077 B1 | 12/2002 | Crow et al. | 356/239.2 |
| 6,518,571 B2 | 2/2003 | Talbot et al. | 250/307 |
| 6,594,416 B1 | 7/2003 | Sargent, IV et al. | 385/24 |
| 2003/0141861 A1* | 7/2003 | Navratil et al. | 324/158.1 |
| 2005/0194990 A1* | 9/2005 | Gothoskar et al. | 324/765 |

* cited by examiner

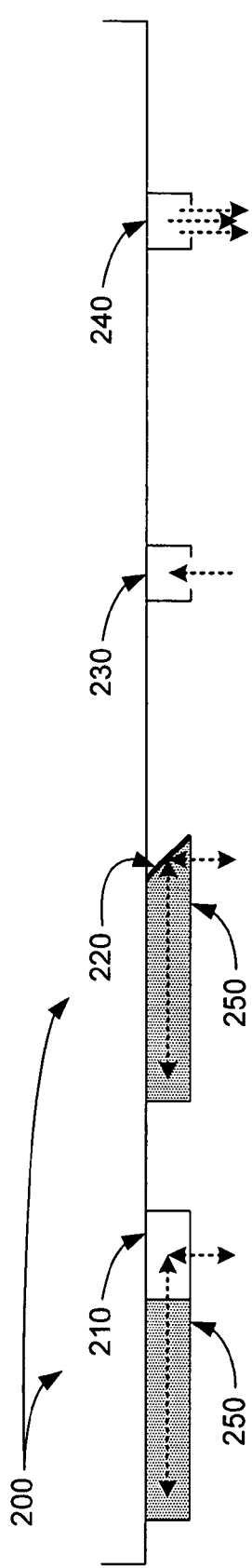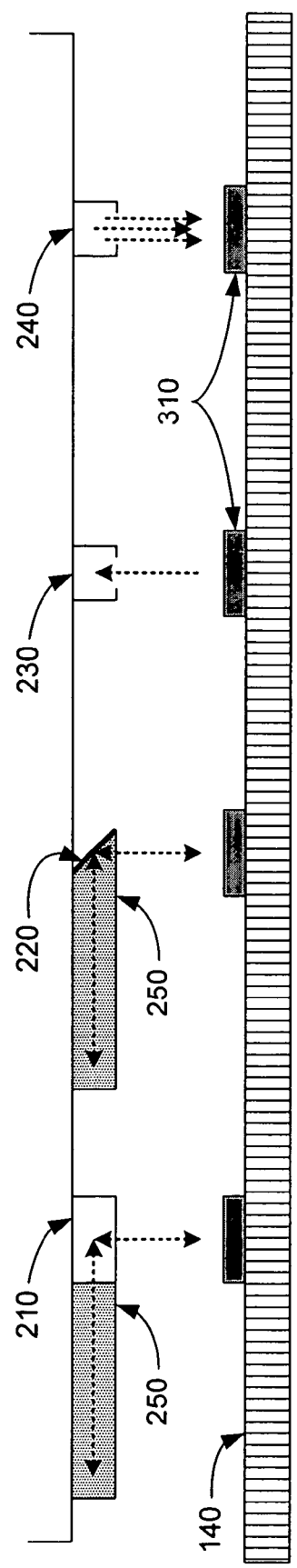

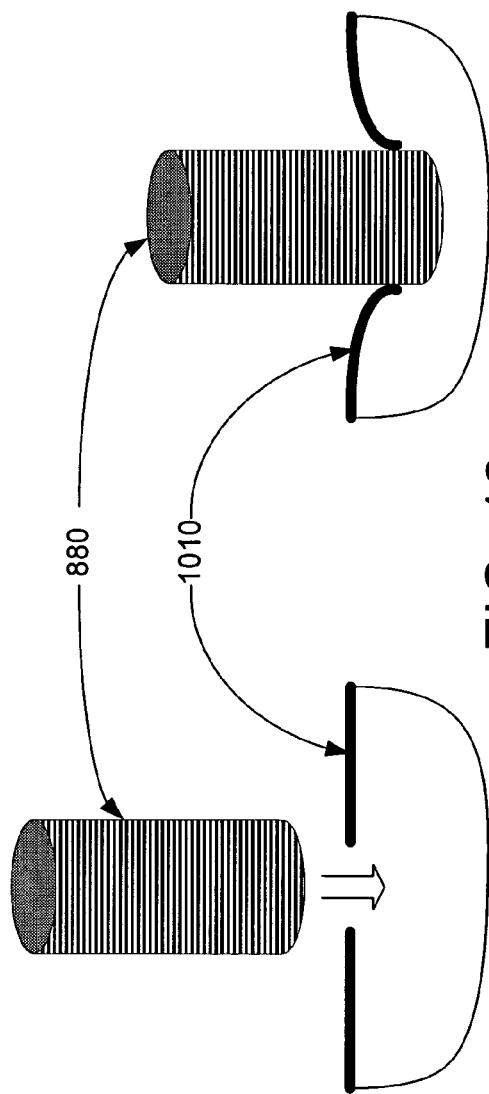
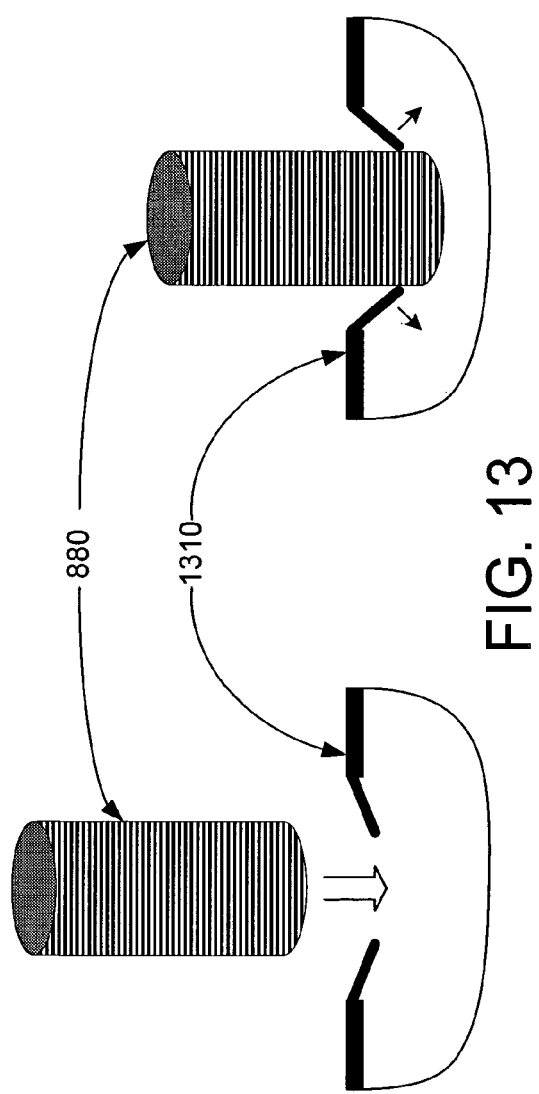

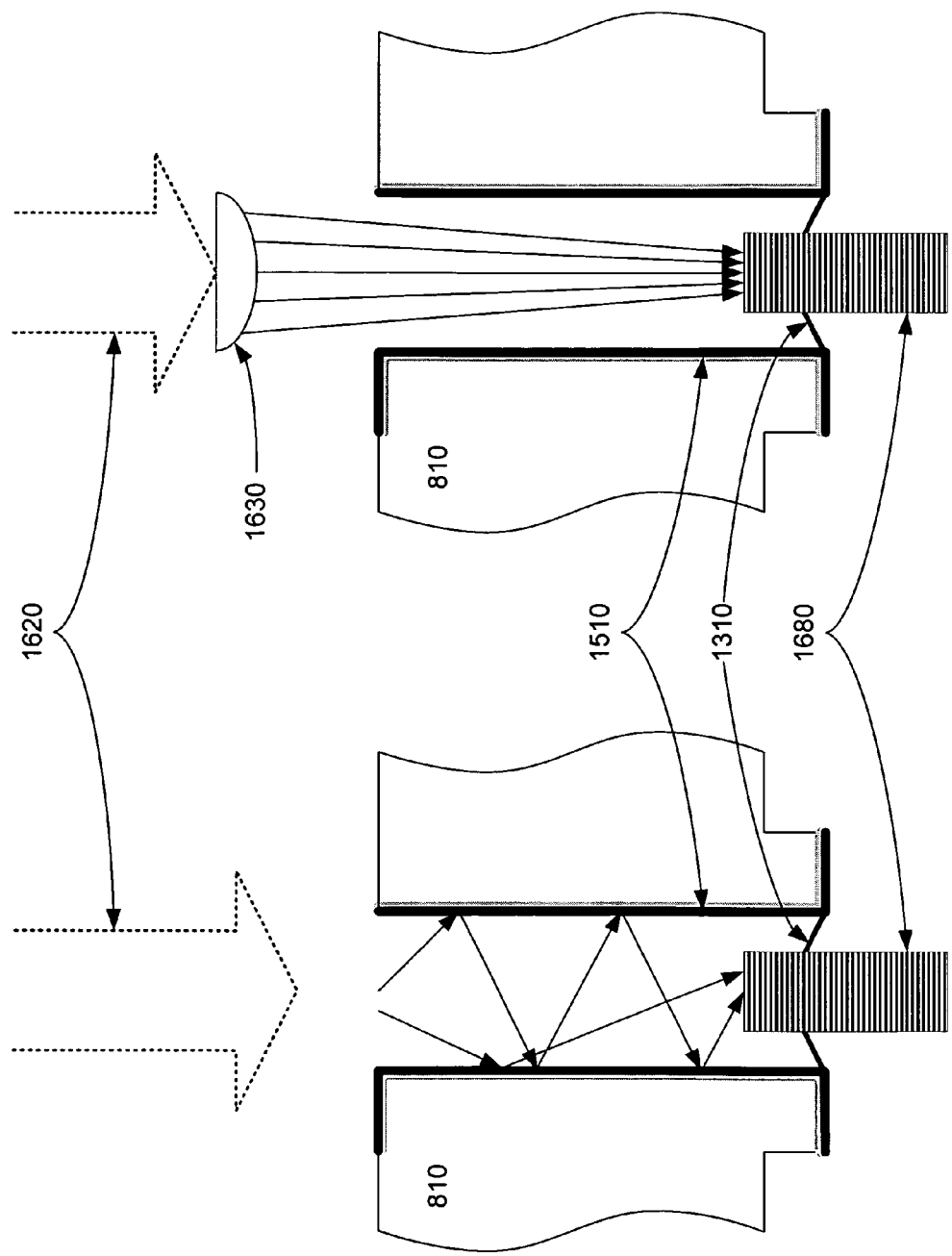

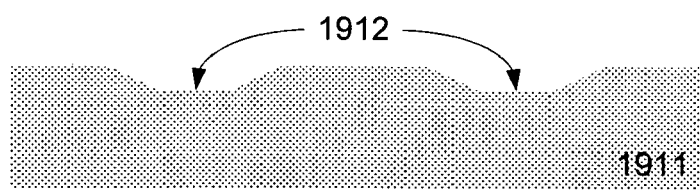
FIG. 19A
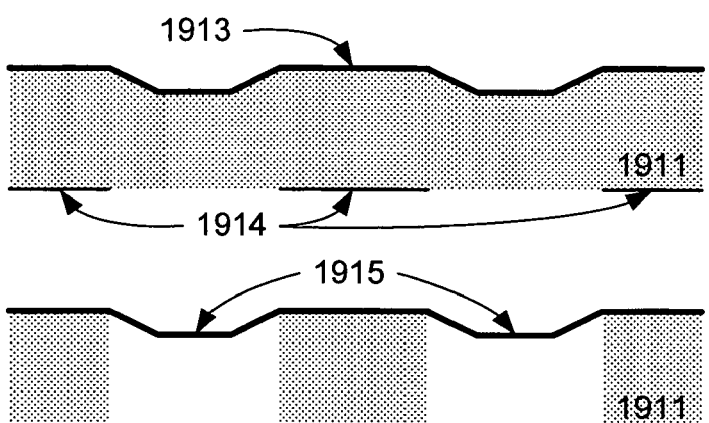
FIG. 19B
FIG. 19C
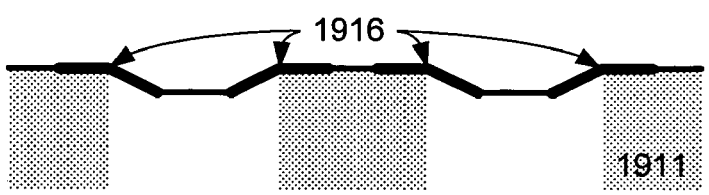
FIG. 19D
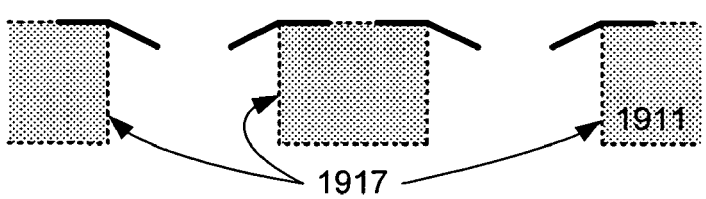
FIG. 19E
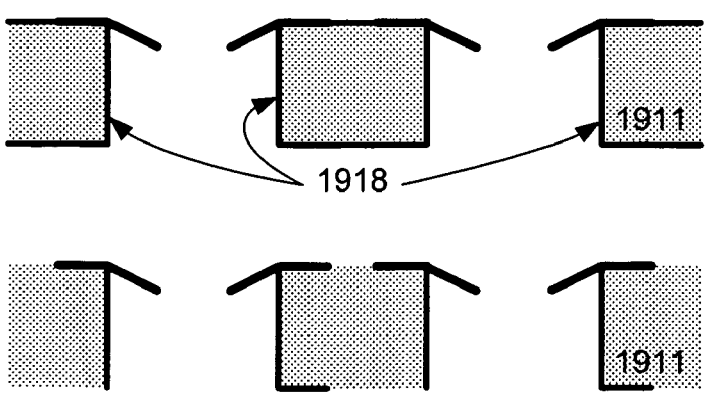
FIG. 19F
FIG. 19G
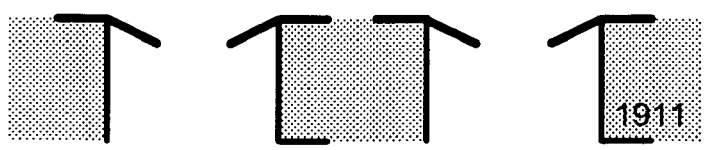

PROBE MODULE FOR TESTING CHIPS WITH ELECTRICAL AND OPTICAL INPUT/OUTPUT INTERCONNECTS, METHODS OF USE, AND METHODS OF FABRICATION

CROSS-REFERENCE TO RELATED APPLICATION

This application claims priority to co-pending U.S. provisional application entitled, "Probe Module for Testing Chips with Electrical and Optical Input/Output Interconnects, Methods of Use, and Methods of Fabrication," having Ser. No. 60/605,871, filed Aug. 31, 2004, which is entirely incorporated herein by reference.

TECHNICAL FIELD

The present disclosure is generally related to probe modules and, more particularly, embodiments of the present disclosure are related to probe modules for wafer-level testing of chips or wafers.

BACKGROUND

In the current manufacture of semiconductor devices, functionality of electrical devices is verified at the wafer level by automated test equipment using probe cards having a set of probe needles that correspond to the electrical bond pads of the electrical device under test. The test equipment positions the probe module such that the probe needles make temporary contact with the corresponding electrical bond pads, energizes the circuit through probe needles connected to power and ground pads, and tests operation of the electrical circuit with the remaining probe needles. The test is repeated for each chip on the wafer. Once the testing is complete, the verified chips are separated and packaged.

The drive to increase chip speeds and signal bandwidth has driven developments in the integration of optical elements in wafer-level devices. In such systems, chips have optical input/output connections fabricated along side conventional electrical connections. Therefore, systems and methods for testing such devices is desirable.

SUMMARY

Probe modules, methods of use of probe modules, and methods of preparing probe modules, are disclosed. A representative embodiment of a probe module, among others, includes a redistribution substrate and a probe substrate interfaced with the redistribution substrate. The probe substrate is operative to test at least one signal of at least one optoelectronic device under test. The probe substrate is operative to interface with electrical and optical components.

Another representative embodiment of a probe module, among others, includes a redistribution substrate and a probe substrate interfaced with the redistribution substrate. The probe substrate includes at least a first probe element to test an electrical signal and at least a second probe element to test an optical signal of an optoelectronic device under test. The probe elements are configured with cantilever arms. The probe substrate is operative to test at least one signal of at least one optoelectronic device under test.

A representative embodiment of a method for fabricating a probe substrate, among others, includes forming a probe element and forming a distribution network. The distribution network includes at least one structure for distributing a signal. The signal is selected from: an electrical signal, an optical signal and combinations thereof.

A representative embodiment of a method for testing, among others, includes method for testing, comprising: providing an optoelectronic probe module and an optoelectronic device under test, wherein the optoelectronic probe module includes an optical element, and wherein the optoelectronic device under test includes an optical element; producing an optical signal in one of the optoelectronic device under test or optoelectronic probe module; and coupling the optical signal between the optical component in the optoelectronic device under test and the optical component in the optoelectronic probe module.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2A through 2D are illustrations of some of the optical elements that can be used for transmitting or receiving optical signals.

FIG. 3A is a schematic representation that illustrates how various optical elements mounted on a probe substrate interact with free-space or quasi-free-space optical input/output interconnects.

FIG. 12 is an illustration of the mechanics of polymer pillar I/Os interfacing with straight thin film cantilever arms.

FIG. 13 is an illustration of the mechanics of polymer pillar I/Os interfacing with angled thin film cantilever arms.

FIG. 16A is a schematic representation of a method for free-space optical distribution through a probe substrate using a metal clad waveguide.

FIG. 16B is a schematic representation of a method for optical distribution through a probe substrate using a focusing element.

FIGS. 19A through 19G are representations of a fabrication process for probe substrates with angled thin film cantilever arms.

DETAILED DESCRIPTION

In general, optoelectronic probe modules of the present disclosure are capable of wafer-level, chip-level, or board-level testing of active and/or passive optical components and electrical components in hybrid optoelectronic/microelectronic devices (e.g., wafers, chips, substrates, and boards having both optical and electrical interconnects). Optoelectronic probe modules use high-density probe and signal redistribution technologies in conjunction with active and/or passive optical components (e.g., photodetectors, photoemitters (e.g., lasers, light emitting diodes (LEDs), and the like.), waveguide interconnections, etc.) to test hybrid optoelectronic wafers, chips, or boards.

The optoelectronic probe modules of the present disclosure can find application in testing and are operative or adapted to test optoelectronic/microelectronic devices that include optical and/or electrical components. In particular, optoelectronic probe modules can be used to test fully packaged wafers (end-of-line or after production) and wafers in-production (i.e., parametric testing during production). For example, optoelectronic probe modules can be used to test high-performance or cost-performance microprocessors, Application Specific Integrated Circuits (ASICs), System-on-a-Chip (SoC) architectures that incorporate multiple technologies (such as RF, optical and MEMs structures), optoelectronic chips for telecommunications, or any other hybrid optoelectronic/microelectronic devices that include optical and electrical components.

Figure 1:
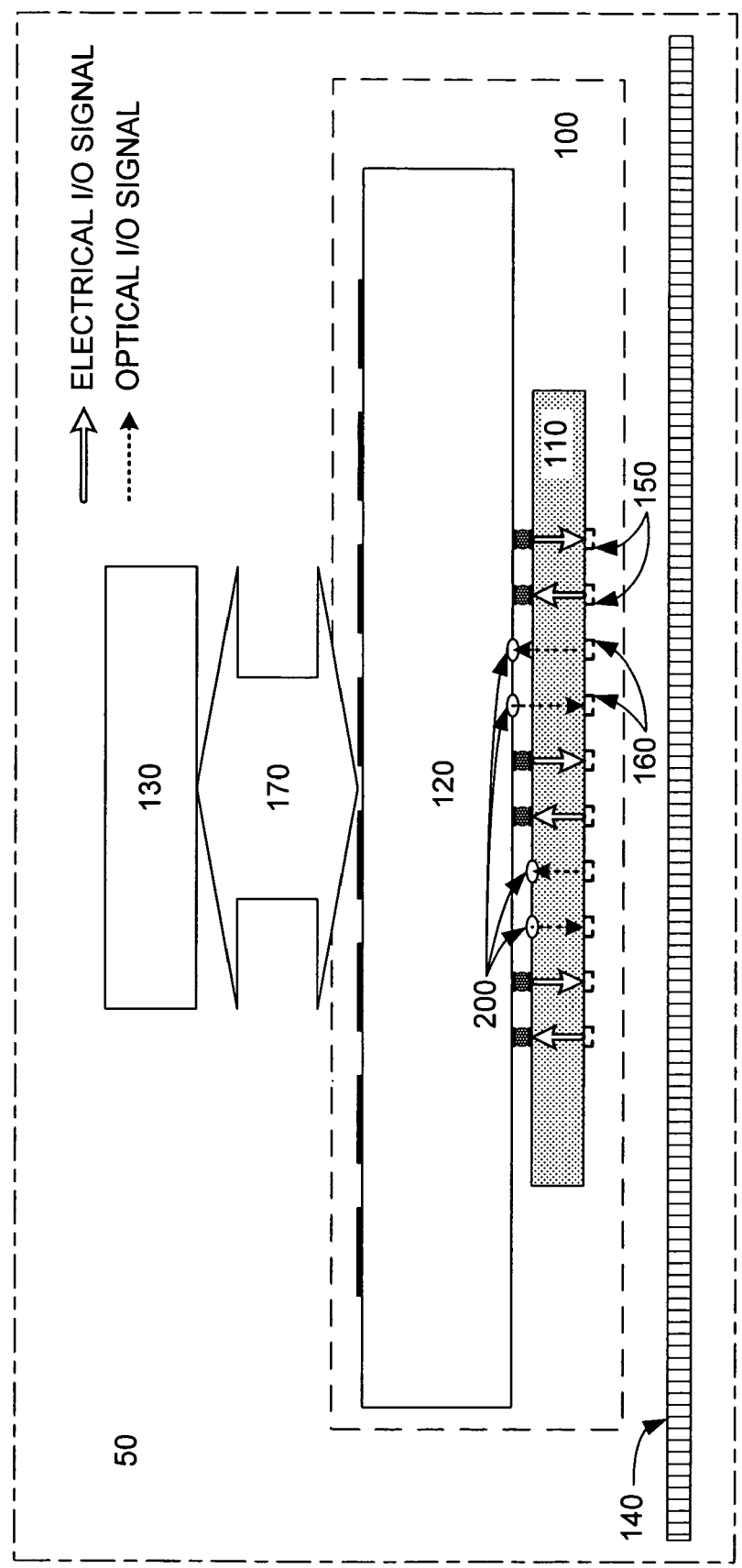
FIG. 1 is a schematic of a representative probe module suitable for testing chips with both electrical and optical input/output signals.

Probe modules include multiple substrates to provide probes for input/output (I/O) connections and redistribution of the I/O signals. FIG. 1 is a schematic that illustrates the setup of an automated test system 50, which includes automated test equipment (ATE) 130, an ATE connection interface 170, a probe module 100, and a device under test (DUT) 140. A probe module 100 includes two types of components: probe substrates 110 and redistribution substrates 120 that are interfaced (e.g., directly or indirectly) with one another. The probe module 100 provides an interface between the ATE 130 and the DUT 140. This can be accomplished using electrical probes 150, optical probes 160, optical elements 200, and combinations thereof, to acquire signals from and send signals to the DUT 140 and redistributing these signals to the ATE 130 through an ATE connection interface 170. The ATE connection interface 170 can be implemented with, but not limited to, electrical wire, optical fiber, and/or fiber optic ribbon. The probe module 100 is designed to be scalable to allow testing of a single I/O connection or multiple I/O connections in parallel. Similarly, the probe module 100 can be used for testing one device or multiple devices in parallel.

A probe substrate 110 is the portion of the probe module 100 that interacts with the DUT I/O through electrical and optical probes 150 and 160 mounted on the face or front-side of the probe substrate 110. The basic, non-limiting implementation utilizes a single probe substrate 110. In other embodiments, multiple probe substrates 110 can be used.

To allow the transmission and reception of electrical I/O signals, an electrical probe 150 necessitates physical contact with an I/O interface of the DUT 140. One measure of good performance of an electrical probe 150 is the ability to perform a large number of probe-to-interface touchdowns while maintaining a low contact resistance (<1 Ω). Likewise, uniform contact with all I/O interfaces of the DUT 140 is an important consideration.

Optical I/O can be accomplished through the use of optical elements 200 located on the probe substrates 110 and/or the distribution substrates 120 and various coupling mechanisms (e.g., free-space, quasi-free-space, waveguide, etc.). FIGS. 2A through 2D illustrate some embodiments of the possible optical elements 200 that can be utilized. In general, optical elements 200 include, but are not limited to, diffractive elements 210, reflective elements 220, photodetectors 230, and light sources 240.

In FIG. 2A, an optical signal from the DUT 140 is directed by a diffractive element 210 (focusing or non-focusing) into a distribution network including a waveguide 250. Similarly, a light source can send a signal through the waveguide 250 where it is directed by the diffractive element 210 to the I/O interface of a DUT 140 (FIG. 1).

In FIG. 2B, a reflective element 220, such as a total internal reflection (TIR) or metallic mirror, can be used to deflect optical signals from an I/O interface of a DUT 140 into a distribution network including a waveguide 250. Similarly, a light source can send a signal through the waveguide 250 where it is deflected by the reflective element 220 to the I/O interface of a DUT 140.

A third embodiment is shown in FIG. 2C where a photodetector 230 is placed directly above an I/O interface of a DUT 140. In this embodiment, the photodetector 230 immediately converts the optical signal received from the DUT 140 into an electrical signal that can be transmitted through an electrical distribution network.

Conversely, as shown in FIG. 2D, an optical signal can be transmitted by a light source 240, such as a vertical cavity surface emitting laser (VCSEL), a light emitting diode (LED), etc., that is placed directly above the I/O interface of a DUT 140. Electrical signals traveling through a distribution network directly control and modulate the transmitted optical signal.

Figure 3B:
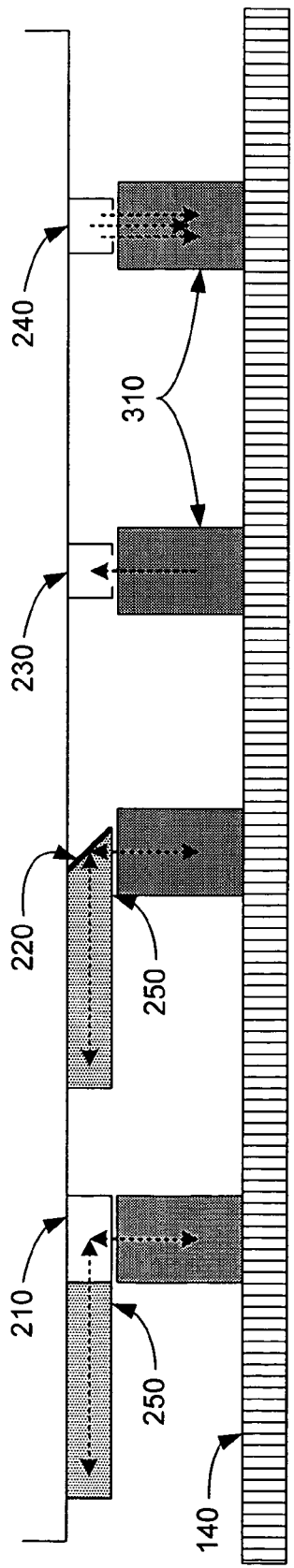
FIG. 3B is a schematic representation that illustrates how various optical elements mounted on a probe substrate interact with guided wave optical input/output interconnects.

In the embodiments having coupling with free-space or quasi-free-space interconnections (FIG. 3A), an optical signal is transmitted through free-space between an optical element 200 (e.g., diffractive element 210, reflective element 220, photodetector 230, light source 240, etc.) and an optical I/O interface 310 on the DUT 140. To maximize power efficiency, the light used in free-space or quasi-free-space I/O can be collimated or focused. Another coupling strategy can utilize guided wave interconnects (FIG. 3B). The guided wave approach dictates that the optical I/O interface 310 extends out from and normal to the surface of the DUT 140. The probe substrate 110 is fabricated such that the optical probe 160 positions an optical element 200 in close proximity to or butt-couples the element with an optical I/O interface 310 of the DUT 140. The close proximity of the optical element 200 to the optical I/O interface 310 provides a high coupling efficiency for signal transmission.

The electrical and optical probes 150 and 160 are laid out to mimic the footprint of the I/O interfaces of the DUT 140. Some of the possible probe distributions include a peripheral array and/or a fully or partially populated area-array. A first level of signal redistribution occurs on the probe substrate 110. Electrical and optical input/output signals are routed between the probes 150 and 160 and the redistribution substrate 120. Electrical signal distribution can be accomplished by using various methods such as, but not limited to, traditional multi-level interconnect technology, while optical signal distribution can be accomplished by using technology such as, but not limited to, optical dielectric and/or photonic crystal waveguides.

Figure 4:
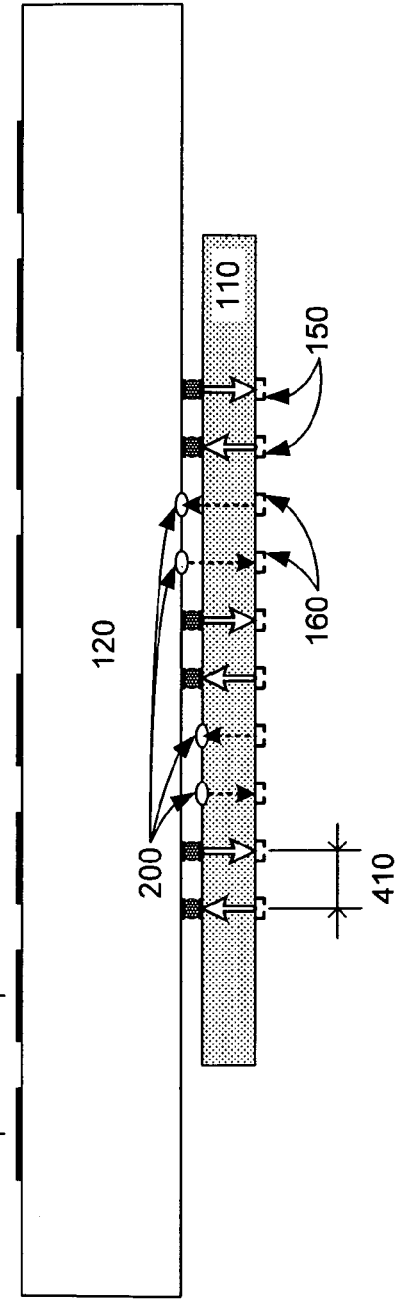
FIG. 4 is an illustration of the automatic test equipment (ATE) pin pitch on the redistribution substrate and the probe pitch on the probe substrate.

The second component of a probe module 100 is a redistribution substrate 120. As shown in FIG. 4, additional routing of I/O signals through distribution networks is provided because the probe spacing or probe pitch 410 is not expected to match with the pin pitch 420 of the ATE connection interface 170. In some instances, an increased pin pitch 420 is desired to accommodate larger ATE interface connections 170 that improve the quality of the test signals. Increasing the number of power and ground pin connections also provides additional routing in the redistribution substrate 120. The basic non-limiting implementation utilizes a single redistribution substrate 120 but, in other embodiments, multiple redistribution substrates 120 can be used.

As stated above, a first level of signal redistribution occurs on the probe substrate 110 where the I/O signals are routed between the probes 150 and 160 and the redistribution substrate 120 through distribution networks. The I/O signals are transferred between the backside of the probe substrate 110 and the redistribution substrate 120 through an array of electrical and optical interconnects. Electrical I/O interconnections can be accomplished through the use of a suitable technology that can include, but is not limited to, solder bumps or conductive adhesives. Optical I/O interconnects can include, but are not limited to, multiple combinations of the placement of a source and/or receiver, optical guiding networks, optical elements 200, polymer pillars, coupling mechanisms on a probe substrate 110, a redistribution substrate 120, and combinations thereof.

Unlike electrical signals, optical I/O cannot be routed through wire or conductors. An optical equivalent can include, but is not limited to, a waveguide 250, an optical fiber, a polymer pillar, combinations thereof, or other suitable technology. The waveguides 250 are commonly used to route optical signals at a substrate level 110 and 120. Unfortunately, because bending reduces the efficiency of the optical waveguides 250, the bend radii are controlled to minimize the power losses produced, which uses more area for routing of the waveguides 250. Eventually, the optical signal is bent normal to the surface of the substrate 110 and 120 so that it can enter and/or exit an optical I/O interface 310 on the DUT 140.

Figure 5A:
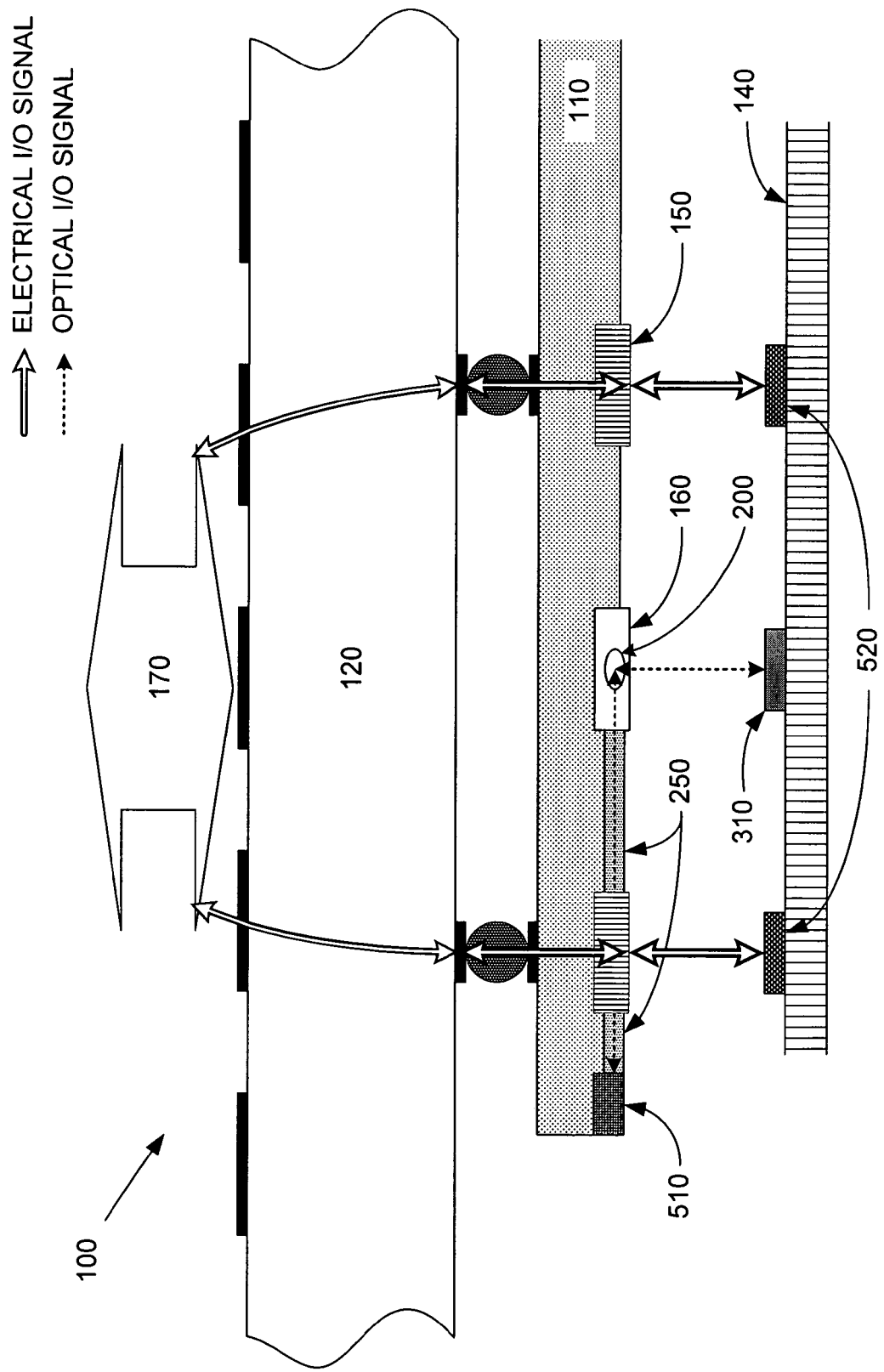
FIG. 5A is a schematic representation of a probe module configuration where the optical redistribution is performed on the front of the probe substrate.
Figure 5B:
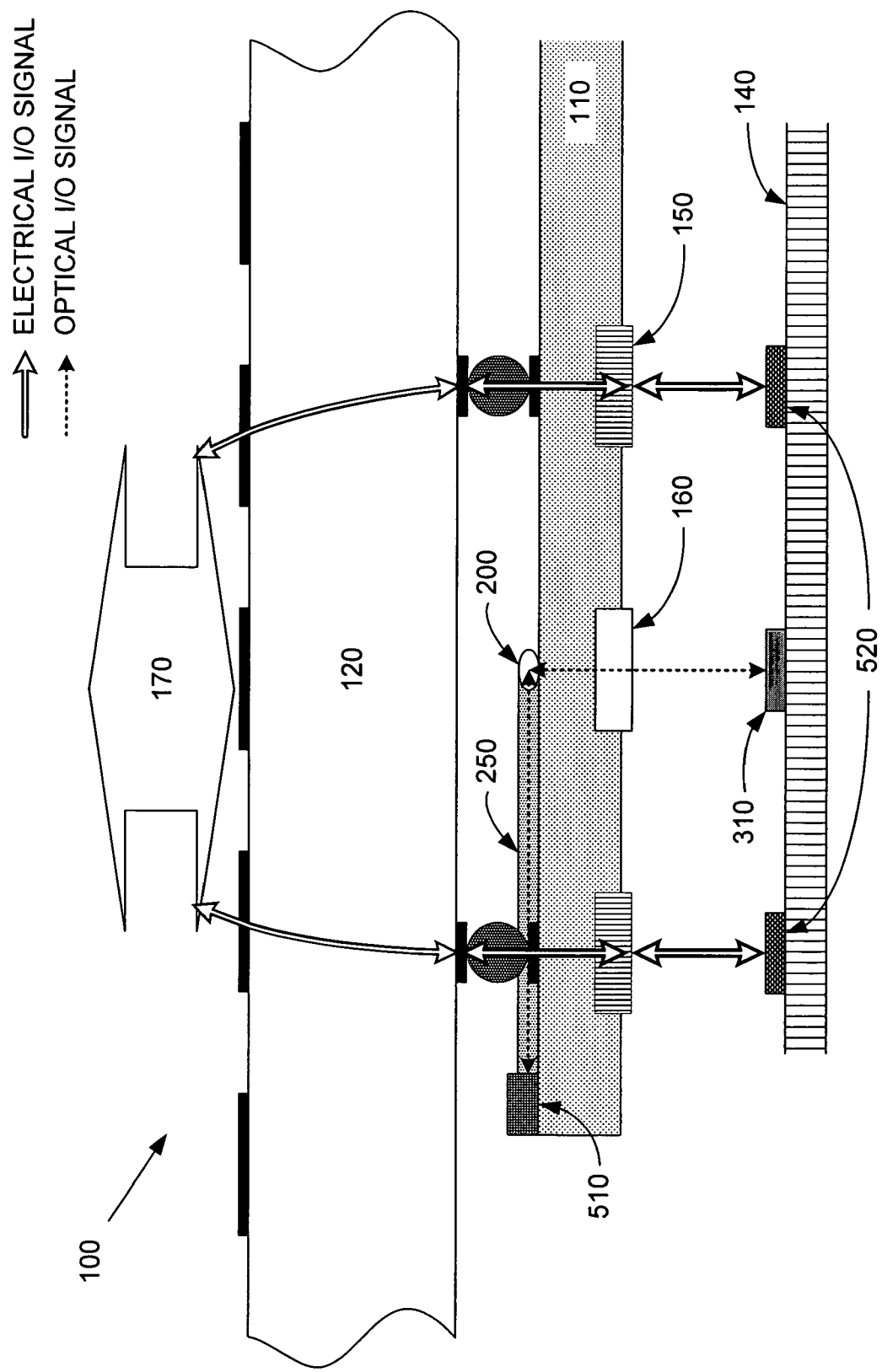
FIG. 5B is a schematic representation of a probe module configuration where the optical redistribution is performed on the back of the probe substrate.
Figure 5C:
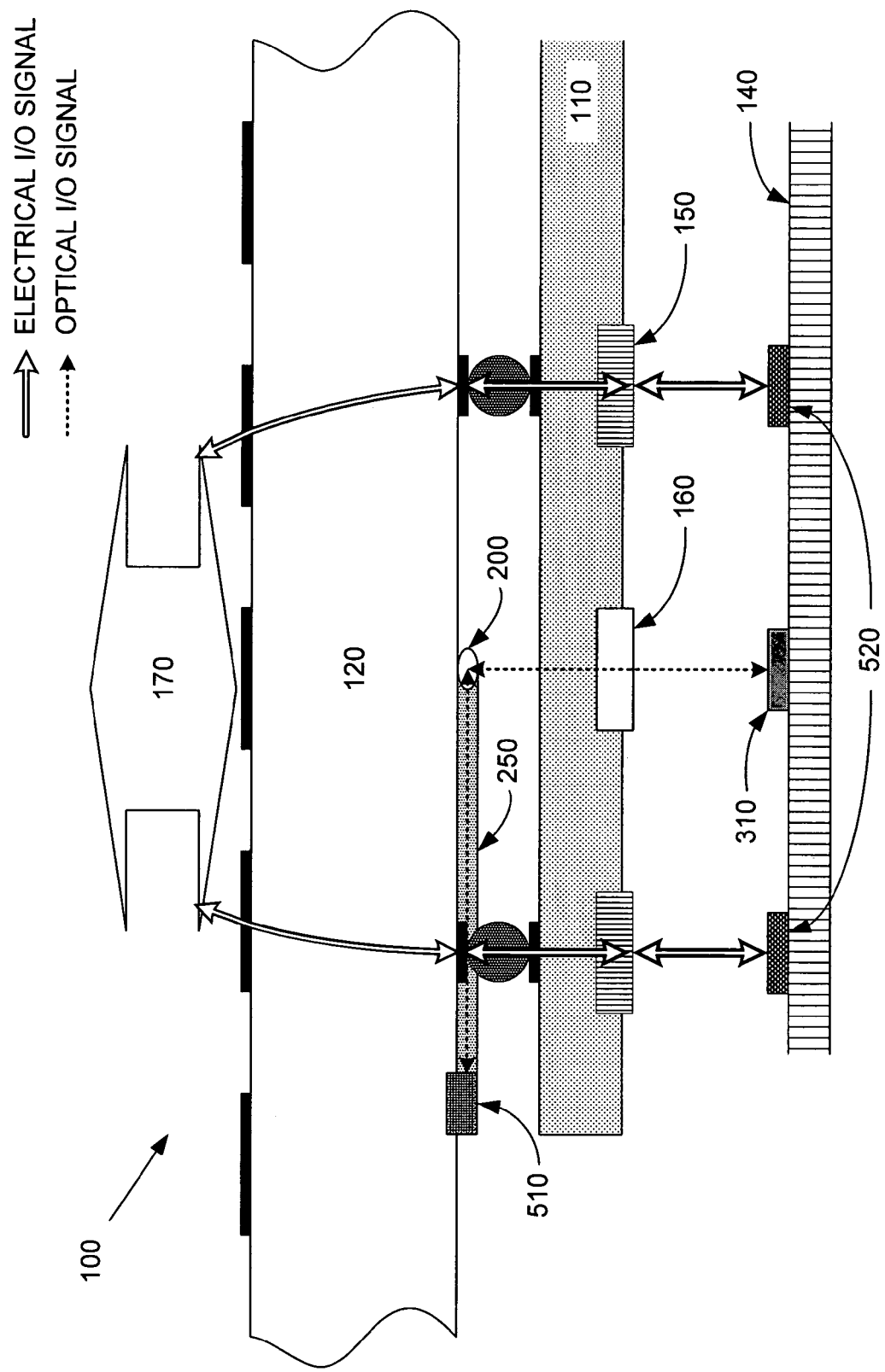
FIG. 5C is a schematic representation of a probe module configuration where the optical redistribution is performed on the front of the redistribution substrate.

Embodiments of optical distribution network configurations that can be utilized in a probe module 100 are illustrated in FIGS. 5A, 5B, and 5C. There is no intent to limit the possible combinations, as other optical distribution network configurations are also possible. In the illustrations, conductive electrical probes 150 make contact with electrical I/O interfaces 520 to complete an electrical signal path between the DUT 140 and the redistribution substrate 120 for transmission of the I/O signals to the ATE 130.

If the number of optical I/O being probed is small, it is possible to have a distribution network utilizing a waveguide 250 integrated onto the face or probe side of the probe substrate 110 as shown in FIG. 5A. In FIG. 5A, an optical signal travels to or from an optical source and/or receiver 510 through a waveguide 250 along the front or probe side of the probe substrate 110. The optical elements 200, such as, but not limited to, diffractive elements 210 (focusing or non-focusing) or reflective elements 220 (metallic or total internal reflection mirrors), are mounted at the edge of waveguides 250 to provide surface normal transmission of an optical signal.

In this embodiment, when an optical signal is an input into the DUT 140, an optical source 510 located on the probe substrate 110 or on the ATE 130 feeds an optical waveguide 250 where an optical element 200 bends the light in a surface normal direction into the optical I/O interface 310. An optical signal originating from the DUT 140 would be captured by an optical element 200 and directed into the waveguide 250 on the probe substrate 110. The waveguide 250 leads to optical receivers 510 that may redirect the optical signals or convert the optical signals into electrical ones.

Processing constraints may not allow the waveguide network 250 to be fabricated on the same side as the probes themselves. If so, the waveguides 250 and optical source and/or receiver 510 can be fabricated on the back (i.e., the side opposite of where the probes are located) of the probe substrate 10 as shown in FIG. 5B. For an optical signal originating from a DUT 140, light is transmitted from an optical I/O interface 310 through an optical element 200 and the waveguide 250 on the back of the probe substrate 110 to an optical receiver 510. Transmission through the substrate 110 can be accomplished using methods such as utilizing wavelengths of light transparent to the substrate material or physically creating a path, via or through-hole (these terms are used interchangeably) for the light such as, but not limited to, a metallized reflective hollow, optical dielectric, photonic crystal waveguide, or optical fiber. Through-holes or vias can also be filled with optically transparent material, such as, but not limited to, polymers to minimize reflection at the detector and help guide the signal from the transmitter to the receiver. Conversely, light from an optical source 510 on the probe substrate 110 entering the waveguide 250 is bent by an optical element 200 and transmitted to the other side of the substrate 110 where it is captured by an optical I/O interface 310.

A third variation of the probe module 100 is shown in FIG. 5C. In this embodiment, a distribution network including a waveguide 250 is fabricated on the front of the redistribution substrate 120 or the side where the probe substrate 110 interfaces with the redistribution substrate 120. Here, the optical probing and redistribution functions are split between the probe and redistribution substrates (110 and 120). An optical signal is transmitted from an optical source 510 and through the waveguide 250 to an optical element 200 located along the front of the redistribution substrate 120. The optical element 200 bends the light in a surface normal direction and sends it through the probe substrate 110 to an optical I/O interface 310 on the DUT 140. Transmission from the DUT 140 to an optical receiver 510 can be accomplished in the opposite direction through the optical element 200 and waveguide 250.

Additional integration of passive optical waveguides 250 within the probe substrate 110 or redistribution substrate 120 allows for a reduction in the number of optical sources used per probe module 100. In this manner, optical output signals from the DUT 140 can be sent back to the DUT 140 as optical input signals. In addition, multiple I/O interfaces on the DUT 140 that use optical excitation can be stimulated by a single optical source located on the DUT 140. Optical sources on the probe substrate 110 or redistribution substrate 120 can also excite multiple I/O interfaces on the DUT 140.

Separation of the probing and redistribution functions imparts a modular design to the probe module 100. During manufacturing and testing, a probe substrate 110 can be rendered useless when one or more probes fail after repeated use. In this modular design of the probe module 100, the damaged probe substrate 110 can be disconnected from the redistribution substrate 120 and replaced. The redistribution substrate 120 containing electrical and optical distribution networks, which can be relatively expensive, can be preserved while the probe substrate 110 becomes a replaceable "probe cartridge" of the probe module 100. The re-workable substrates may also prove useful in the event that an optoelectronic device on the redistribution substrate fails. In addition, this modular configuration provides the ability to update the probe layout on the probe substrate 110 to coincide with modifications to an existing DUT 140 or to redesign the probe layout for testing new devices without changing the existing redistribution substrate 120.

Figure 6:
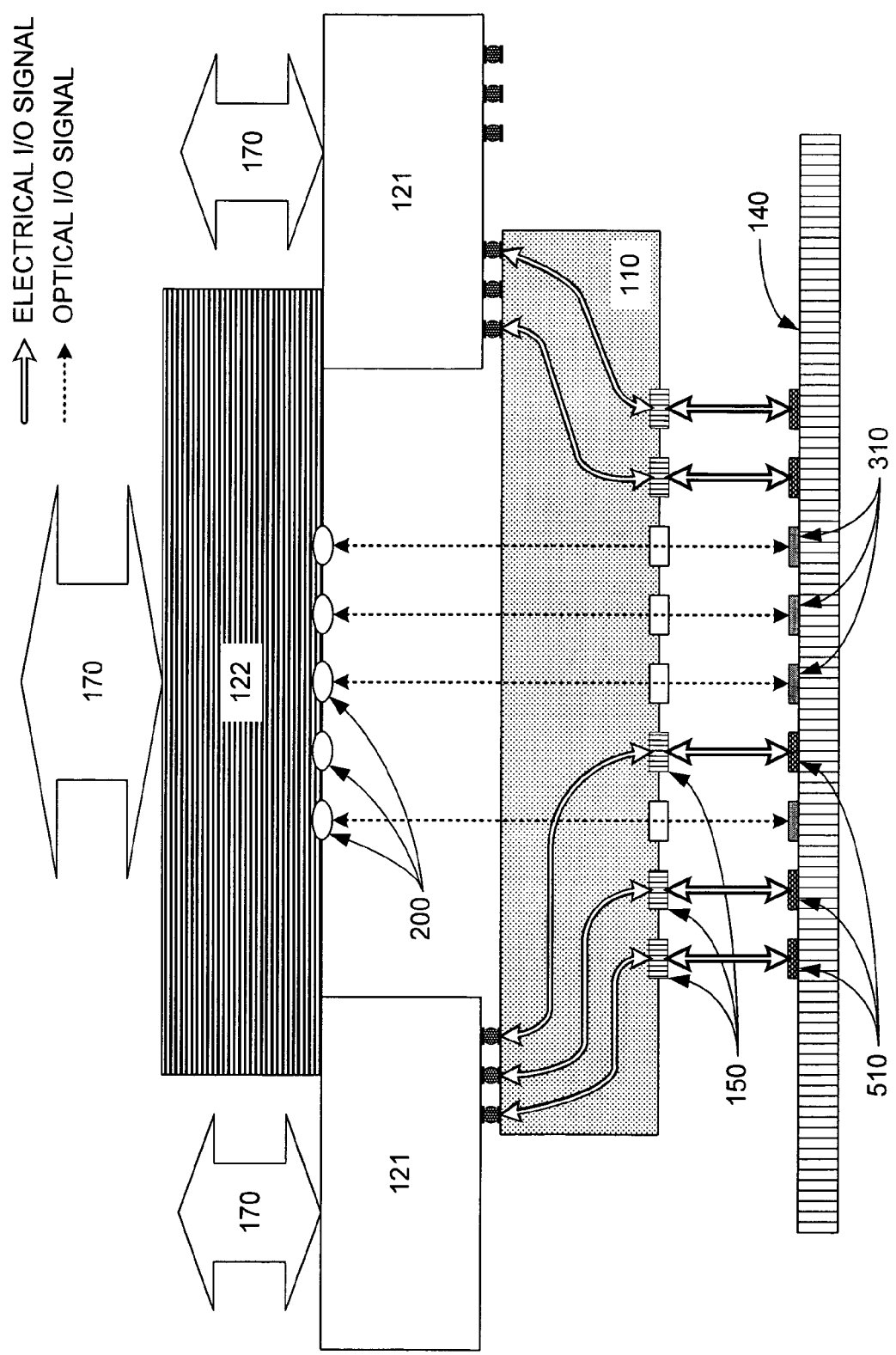
FIG. 6 is a schematic representation of a probe module where the optical redistribution and the electrical redistribution are performed on separate substrates.

Providing optical and electrical distribution networks on separate substrates, as shown in FIG. 6, can increase the modular design of the probe module 100. In this non-limiting example, the electrical signals from the DUT 140 are routed to the peripheral region of a probe substrate 110 without blocking the optical I/O signals. The electrical I/O signals are transferred between the backside of the probe substrate 110 and an electrical redistribution substrate 121 through an array of electrical interconnects. The electrical signals are distributed to and/or from the ATE 130 through an ATE connection interface 170.

The electrical redistribution substrate 121 has an opening in its center that is aligned over the array of optical I/O interfaces 310. A separate optical redistribution substrate 122 is attached over the opening of the electrical redistribution substrate 121. Optical elements 200 mounted on the optical redistribution substrate 122 allow transmission of optical signals to and/or from the DUT 140 through the probe substrate 110. Other possible embodiments can include multiple electrical redistribution substrates 121 that are separated to provide an opening for one or more optical redistribution substrates 122. The optical signals can be distributed to and/or from the ATE 130 through an ATE connection interface 170 utilizing optical fibers or fiber ribbons to guide the optical signals or converting optical signals to and/or from electrical signals before distribution.

In another non-limiting embodiment not depicted here, the redistribution substrate can include optical fibers or fiber ribbons as an optical distribution network. Optical signals can be directly routed between the probe substrate and the ATE through optical fibers or fiber ribbons connected to the backside of the probe substrate. Additional optical and electrical distribution networks can be incorporated on the redistribution substrate as needed.

Figure 7:
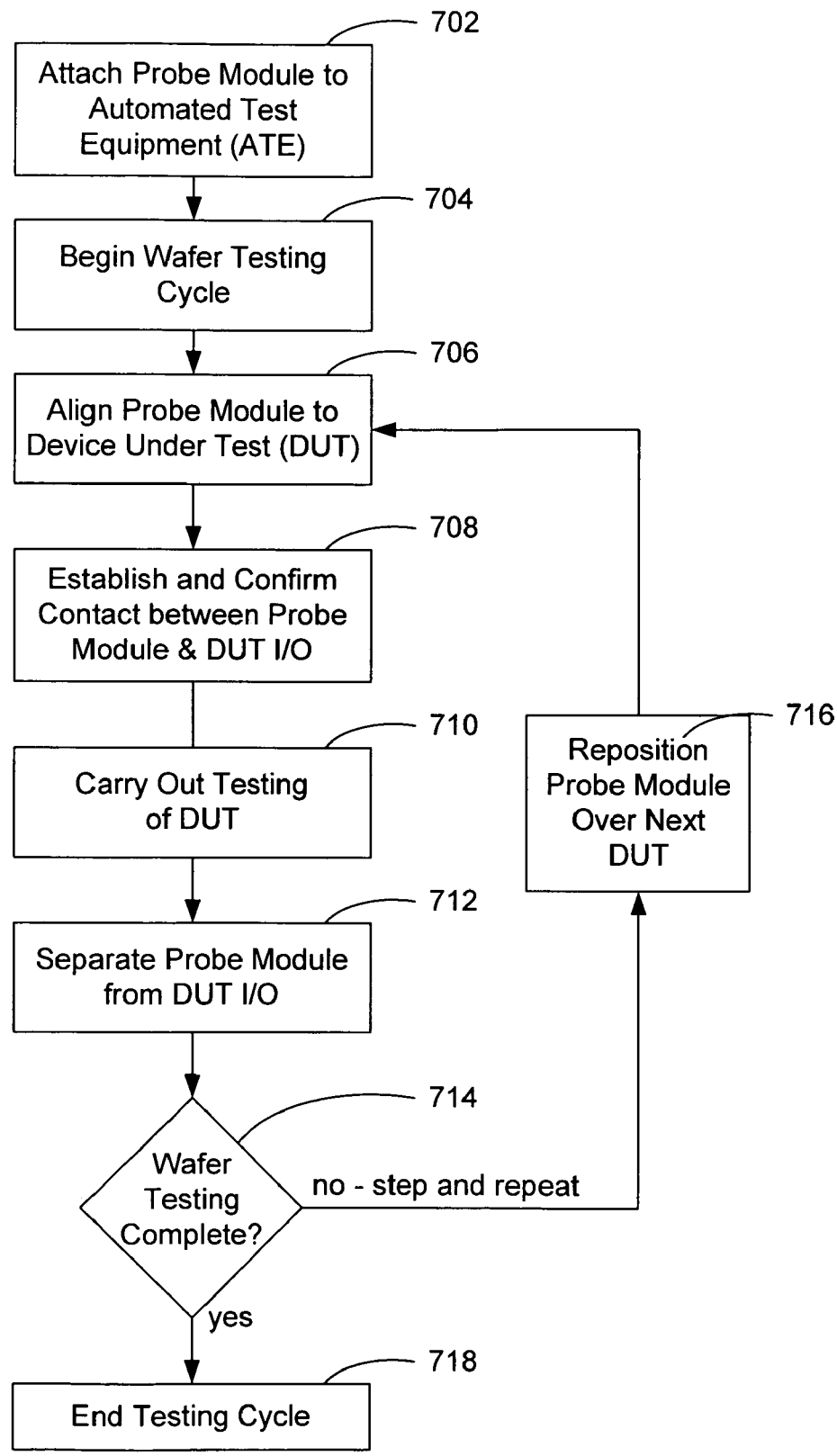
FIG. 7 is a flow chart describing the use of a probe module.

The design of the probe module 100 is such that it can be used in an automated test system 50 that can include, but is not limited to, traditional as well as future automated test equipment (ATE) 130, which can include tooling to handle and analyze electrical and/or optical signals. An exemplary sequence for testing with an automated test system 50 using probe module 100 is shown in the flow chart of FIG. 7. This is one, non-limiting example of a testing process, with other implementations possible. For example, additional steps such as, but not limited to, cleaning the probes 150 and 160 can also be included in other implementations.

The load arm of the ATE 130 is fit with a probe module 100 for testing a DUT 140 (702), and the test cycle is activated (704). The probe module 100 would be positioned over a wafer or DUT 140. The ATE 130 would use an alignment system, such as, but not limited to, a split optic machine vision subsystem, to line up fiducials on the probe module 100 to corresponding alignment marks on the DUT 140 (706). Typically, machine vision systems can perform alignments to an accuracy of better than 1 μm. Manual alignment of the two components is also possible.

Once aligned, either the tester arm is lowered or the chuck on which the wafer or DUT 140 sits is raised until the DUT 140 and probe module 100 are in contact with one another. Contact can be verified when an electrical path is complete between the two components (708). After contact, the probe module can be driven slightly further (overdriven) to ensure not only that the I/O being tested have been contacted but also that a good contact exists. The test is then performed, (710) and, upon completion the DUT 140 and probe module 100 are separated (712).

The ATE then determines if the wafer testing is complete (714). If there are more interfaces to be tested, the process realigns the probe module 100 to the next DUT 140 (716) and repeats testing steps 706 to 712 in a stepwise fashion. If testing of the interfaces on the wafer or DUT 140 has been completed, then the test cycle is terminated (718).

Now having described an optoelectronic probe module in general, an example of a possible embodiment of a probe module 100 will be discussed. While embodiments of the optoelectronic probe modules 100 are described in connection with the example and the corresponding text and figures, there is no intent to limit embodiments of the probe modules to these descriptions. On the contrary, the intent is to cover all alternatives, modifications, and equivalents included within the spirit and scope of embodiments of the present disclosure.

Figure 8:
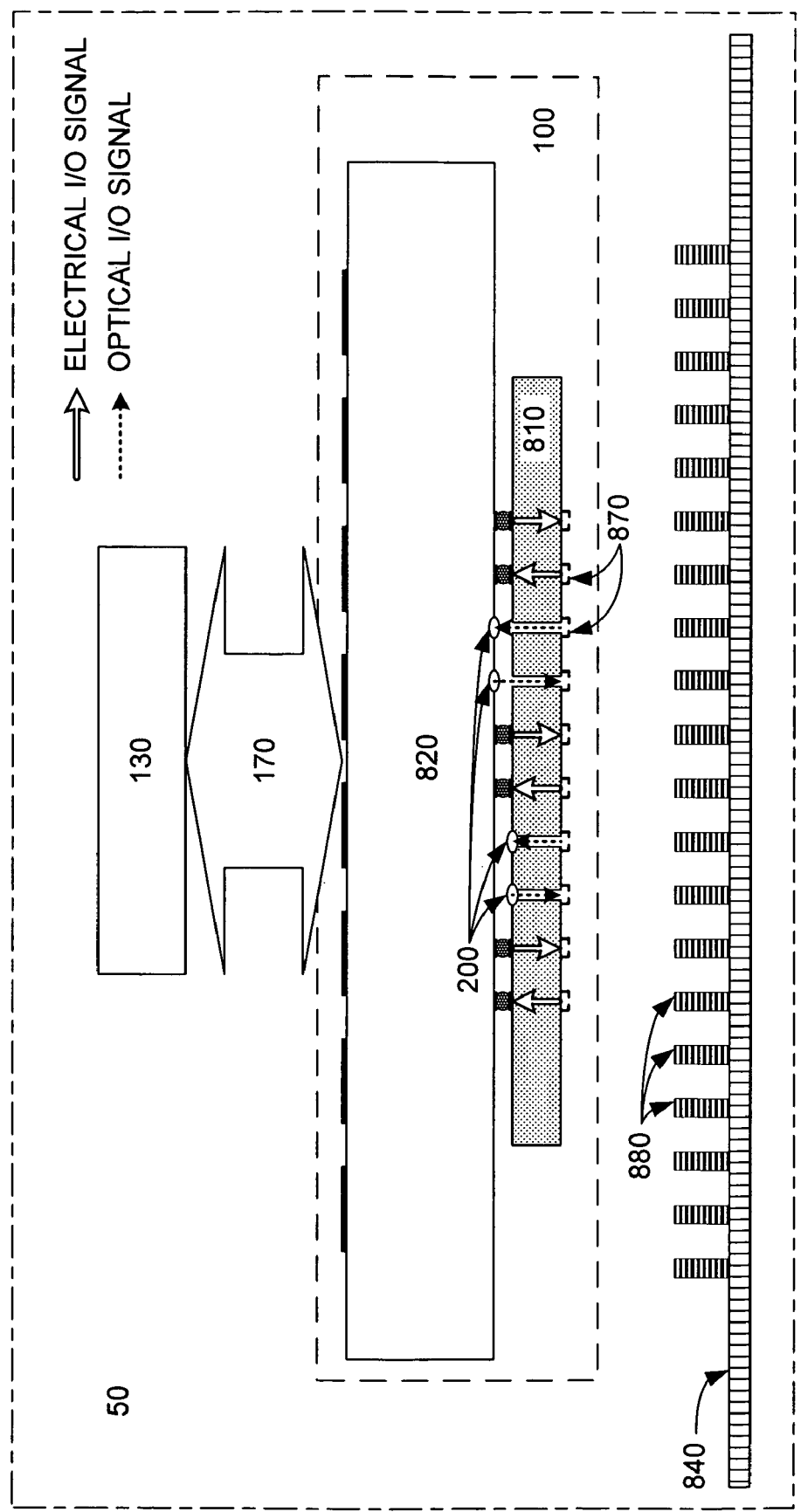
FIG. 8 is a schematic representation of a representative probe module suitable for both electrical and optical input/output signals provided through a sea of polymer pillar interconnects.

One of the many possible embodiments of a probe module 100 enables testing a device with polymer pillar based electrical and optical I/O interfaces or interconnects. This is shown in FIG. 8 where the electrical and/or optical interfaces of a device under test (DUT) 840 are provided by a sea or array of polymer pillars 880. The Sea of Polymer Pillars (SoPP) is a very high-density array of chip-to-module I/O interconnects in the shape of pillars atop the surface of the DUT 840. The pillars are intended for fabrication at the wafer level following completion of back end-of-line (on-chip interconnect) processing. To extend the benefits of wafer level processing, it is desirable to have a technology that allows a device with polymer pillar I/O to be tested and burned-in, at the wafer level, prior to separation into individual chips and attachment to individual modules. The described probe module 100 enables testing of DUTs 840 with polymer pillar based electrical and/or optical I/O interconnects 880 at the wafer level.

As described previously, the probe substrate 810 interacts with the I/O interface of the DUT 840. The probe substrate 810 contains probes 870 designed to contact the polymer pillar I/O 880 of the DUT 840. The layout of the probes 870 mimics the footprint of the polymer pillars 880 on the DUT 840. Some of the possible probe distributions include, but are not limited to, a peripheral array and/or a fully or partially populated area-array. A first level of redistribution is provided on the probe substrate 810 to route the I/O signals from the probes 870 to the redistribution substrate 820.

Figure 9:
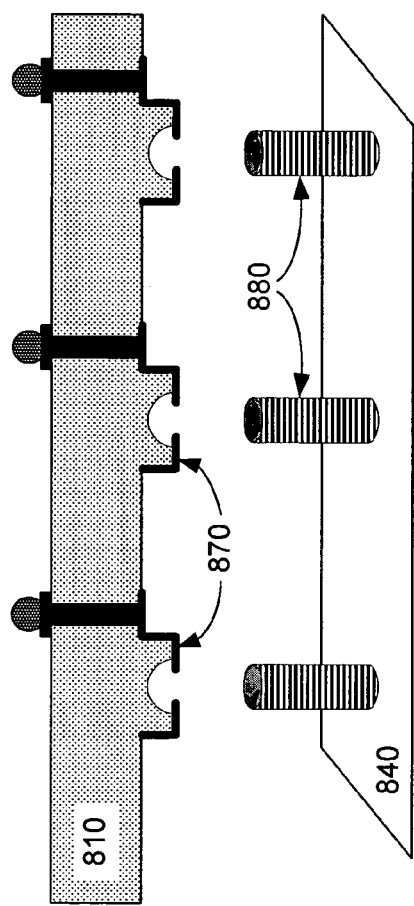
FIG. 9 is a schematic representation of a probe substrate configuration for polymer pillar based electrical input/output interconnects.

The post-like structure of SoPP and polymer pillar based I/O interfaces 880 is illustrated in FIG. 9. The polymer pillars 880 can be metallized for electrical signal transmission or can be produced as micro-optical fibers for guided wave optical signal transmission. The polymer pillars 880 can also be designed for other forms of transmission (e.g., radio frequency (RF) through RF waveguides). While the polymer pillars 880 can be fully metallized, it is also possible to coat only the sidewall of the pillar (and not the top end). Metal lined pillars can serve the dual purpose of electrical and optical transmission through the same interface.

Various probe structures for contacting polymer pillar based or SoPP structures can be used. Using a traditional horizontal contact-and-slide probe would potentially damage the highly compliant (vertically and laterally) polymer pillars. In one possible non-limiting embodiment, a cantilever probe structure is proposed to assure good contact with the pillars 880. The purpose of the cantilever probes for electrical pillars is to create an electrical path for transferring signals to and from, and supplying power to the DUT 840. If the polymer pillars 880 on the DUT 840 are optical I/O interfaces, then the cantilever probes serve as placeholders that contact the pillar 880, while optical signals can be transmitted to or collected from the optical pillar.

Figure 10B:
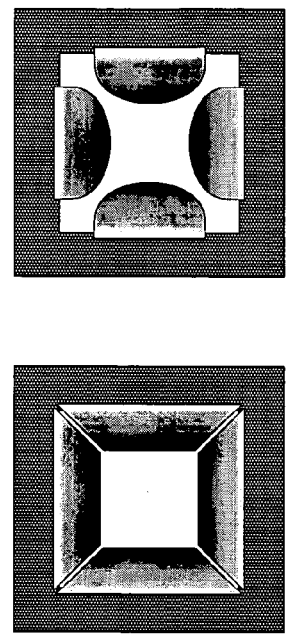
FIG. 10B illustrates top views of cantilever probe configurations.
Figure 10A:
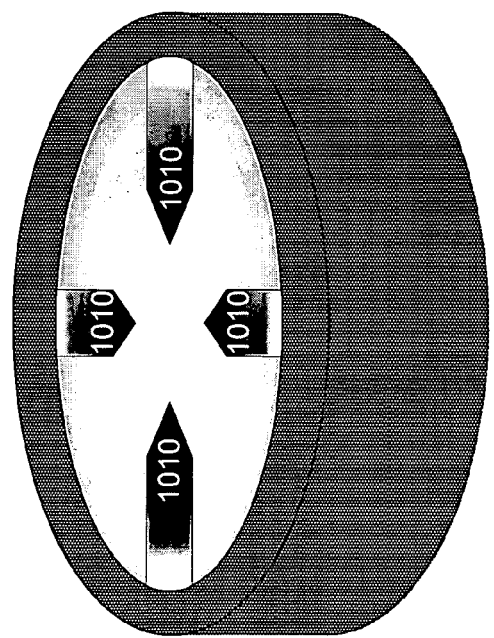
FIG. 10A is a three dimensional view of a cantilever probe for a single polymer pillar.

A three-dimensional view of a cantilever probe is shown in FIG. 10A. Each cantilever probe includes at least one, but preferably many, thin-film cantilever arm(s) 1010. Multiple cantilever arms 1010 add redundancy to the design with no additional cost to the production process. They also assure multiple points of contact to each I/O interconnect, thus reducing the contact resistance. In addition, the arms optimize the alignment of the optical I/O interfaces. Top views of some, but not all, other possible cantilever probe configurations are illustrated in FIG. 10B.

While the opening in the center of the probe is determined by the dimensions of the polymer pillar to be probed, the cantilever arm 1010 dimensions can vary based on the design. In general, the arm dimensions can range from about 1 μm to 200 μm in length, about 1 μm to 100 μm in width, and about 1 μm to 50 μm in thickness. In addition, the arm dimensions can range from about 5 μm to about 25 μm in length, about 3 μm to about 25 μm in width, and about 1 μm to about 15 μm in thickness. In some embodiments, the arm dimensions can range from about 10 μm to 20 μm in length, about 5 μm to 15 μm in width and about 3 μm to 10 μm in thickness.

Figure 11B:
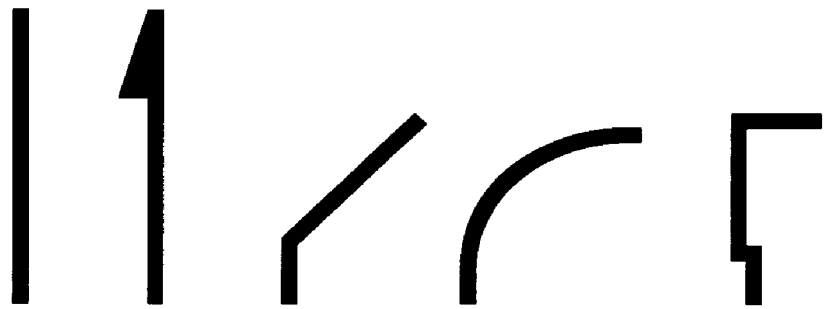
FIGS. 11A and 11B are illustrations of embodiments of cantilever shapes.
Figure 11A:
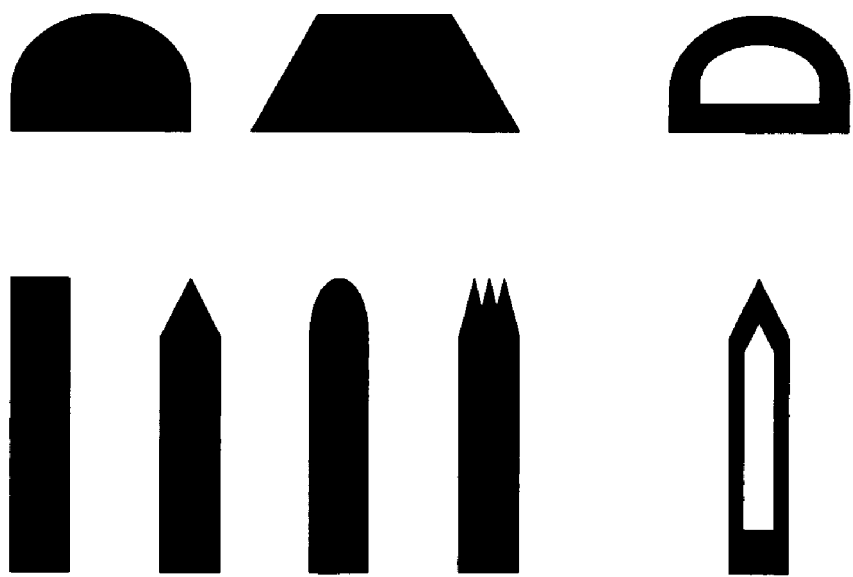

FIG. 11A illustrates top views and FIG. 11B illustrates side views of some possible cantilever shapes. Other probe tip shapes and topographies (side or longitudinal section profiles) other than those illustrated can also be used. The cantilever arm 1010 design optimizes such properties as compliance, stress, elasticity, high conductivity, and non-tarnishing. Structural dimensions and designs can include, but are not limited to, single solid arms or hollow arms utilizing dual load bearing elements, as depicted in FIG. 11A, and can be chosen to provide optimized performance. Likewise, material choices influence probe performance including, but are not limited to, soft, springy metal and alloys, bi-metals, or non-conductive polymers/dielectrics. In addition, metal coatings or layers can be included to further tune the arm properties.

When the probe 870 and the polymer pillar 880 are brought into contact as shown in FIG. 12, the thin-film cantilever arms 1010 flex to give way to the pillar 880. As the polymer pillar 880 pushes the cantilever arm 1010 out of its way, it experiences a lateral reaction force from the cantilevers. This reaction force, along with the relative vertical motion between the probe 870 and the pillar 880, gives rise to a vertical sliding contact between the probe arms 1010 and the surface of the polymer pillar 880. In the case of metallized probe arms and a metal clad pillar, a sliding motion is an effective way to establish contact between two metallic surfaces. The sliding motion may push contamination away and may help break through any non-conductive film that might have formed on the metal.

FIG. 13 shows a non-limiting variation of a probe using an angled (or bent) cantilever arm 1310. In this embodiment, an angled cantilever arm 1310 still provides sliding contact during the probing process while experiencing lower tensile stress compared to a straight cantilever arm 1010. The lower stress level improves the reliability and longevity of the probe. Other non-limiting variations can utilize probe arms that are shaped as depicted in FIG. 11B.

Another possible probe design would use polymer pillars for optical probing. Polymer pillars used as probes 870 on the probe substrate 810 would be aligned in close proximity to or butt-coupled to the polymer pillars 880 of the DUT 840. Optical I/O signals could then be transmitted between the ATE 130 and the DUT 840.

Once contact with the pillars 880 on the DUT 840 has been successfully achieved, a first level of redistribution is used to get the high-density I/O signals from the probes 870 on the probe substrate 810 to the redistribution substrate 820. Electrical signal distribution can be accomplished through a distribution network using various methods such as, but not limited to, traditional multi-level interconnect technology as illustrated in FIG. 9. Probes connected to metallized through-holes or vias can also be utilized to transfer both electrical and optical signals to the backside of the probe substrate 810 as shown in FIG. 14.

Figure 15:
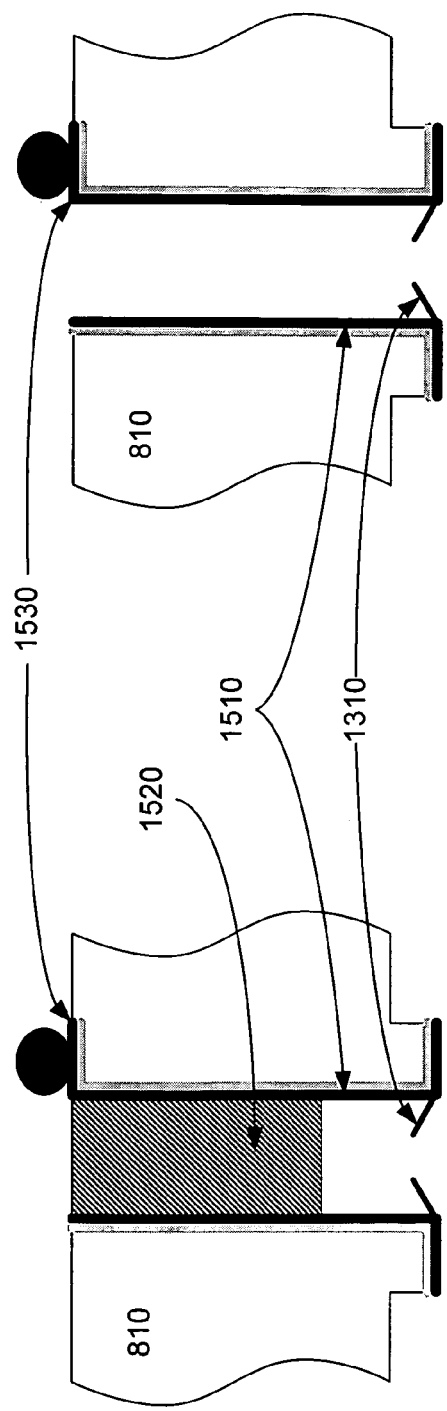
FIG. 15 shows schematic representations of methods for electrical distribution through a probe substrate.

For electrical transmission, the through-holes can be lined or plugged with a conductive material (FIG. 15) to facilitate transmission. In this non-limiting illustration, cantilever probe arms 1310 can provide positive contact with a polymer pillar 880. A thin film or cladding of conductive material 1510 is deposited on the sidewalls of the through-hole to route signals to an electrical interconnect or bond pad 1530 that, using suitable technology such as, but not limited to, solder bumps or conductive adhesives, connects to a redistribution substrate 820. A through-hole can also be plugged with conductive material 1520 to improve electrical signal transmission.

For optical transmission, the through-holes can also be lined with a conductive material (FIG. 15) to facilitate transmission. In addition, the through-hole can be filled with optically transparent material, such as, but not limited to, polymers to minimize reflection at the detector and help guide the signal. If the material of the probe substrate 810 is transparent to the wavelength of light being used, then no specific wave guiding structure is used for through-substrate optical transmission. This feature defines the selection of substrate materials and useful wavelengths that can be utilized.

Figure 14:
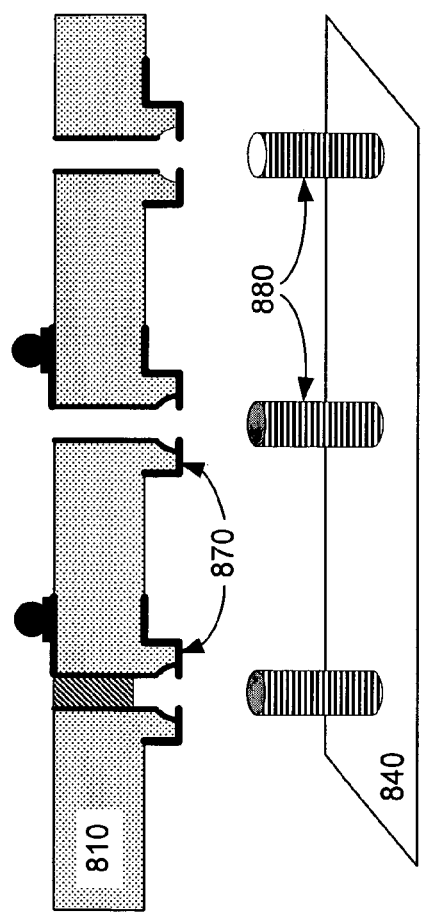
FIG. 14 is a schematic representation of a probe substrate configuration for polymer pillar based electrical and optical input/output interconnects.

In a non-limiting example, a guided wave approach, as shown in FIG. 14, can be adopted for optical signal distribution. FIG. 16A shows an optical polymer pillar 1680 in contact with the cantilever arms 1310 of a probe, which leads to a metal clad through-hole in the probe substrate 810. An unfocused optical signal or light 1620, entering the through-hole from the backside of the probe substrate 810, reflects off the sidewalls of the through-hole and enters a polymer pillar 1680. The film 1510 on the sidewalls of the through-hole acts as a mirror to reflect the light toward the optical pillar 1680. In this example, not all light entering the through-hole will enter the polymer pillar 1680, causing some power to be lost. Keeping the dimension of the via opening about the same as the polymer pillar 1680 lowers power losses. Likewise, light emitted from an optical pillar 1680 reflects off the sidewall cladding of the through-hole and is guided to the backside of the substrate. In this embodiment, the through-hole acts as an optical waveguide.

The substrate through-hole can also be used as an opening in the probe substrate 810. While using the through-hole as a waveguide could result in some optical power being lost, using it simply as a light path would minimize the loss. Making the via much larger than the anticipated optical beam width avoids reflections and thus, the accompanying power losses. In addition, reflections can also be avoided by using focused beams for transmission through the via as shown in FIG. 16B. A focusing mechanism 1630, such as a focusing diffractive element or microlens, could be used to focus the optical signal from the source of the transmission onto the optical polymer pillar 1680.

The first level of signal redistribution is performed on the probe substrate 810 where signals from polymer pillars 880 are routed from probes 870 to the redistribution substrate 820. Electrical signals are transferred from the probe substrate to the redistribution substrate through electrical interconnects or bond pads 1530 using solder bumps, conductive adhesives, or other suitable technology. Optical signals can be sent to the redistribution substrate 820 in many ways using sources, receivers, waveguide networks, and/or surface normal coupling mechanisms located on one or more substrates, as discussed previously. Some possibilities include, but are not limited to, redistribution on the probe substrate 810 or allowing the signal to pass through the probe substrate 810 directly to the redistribution substrate, as illustrated in FIGS. 5A through 5C and FIG. 6.

Figure 16C:
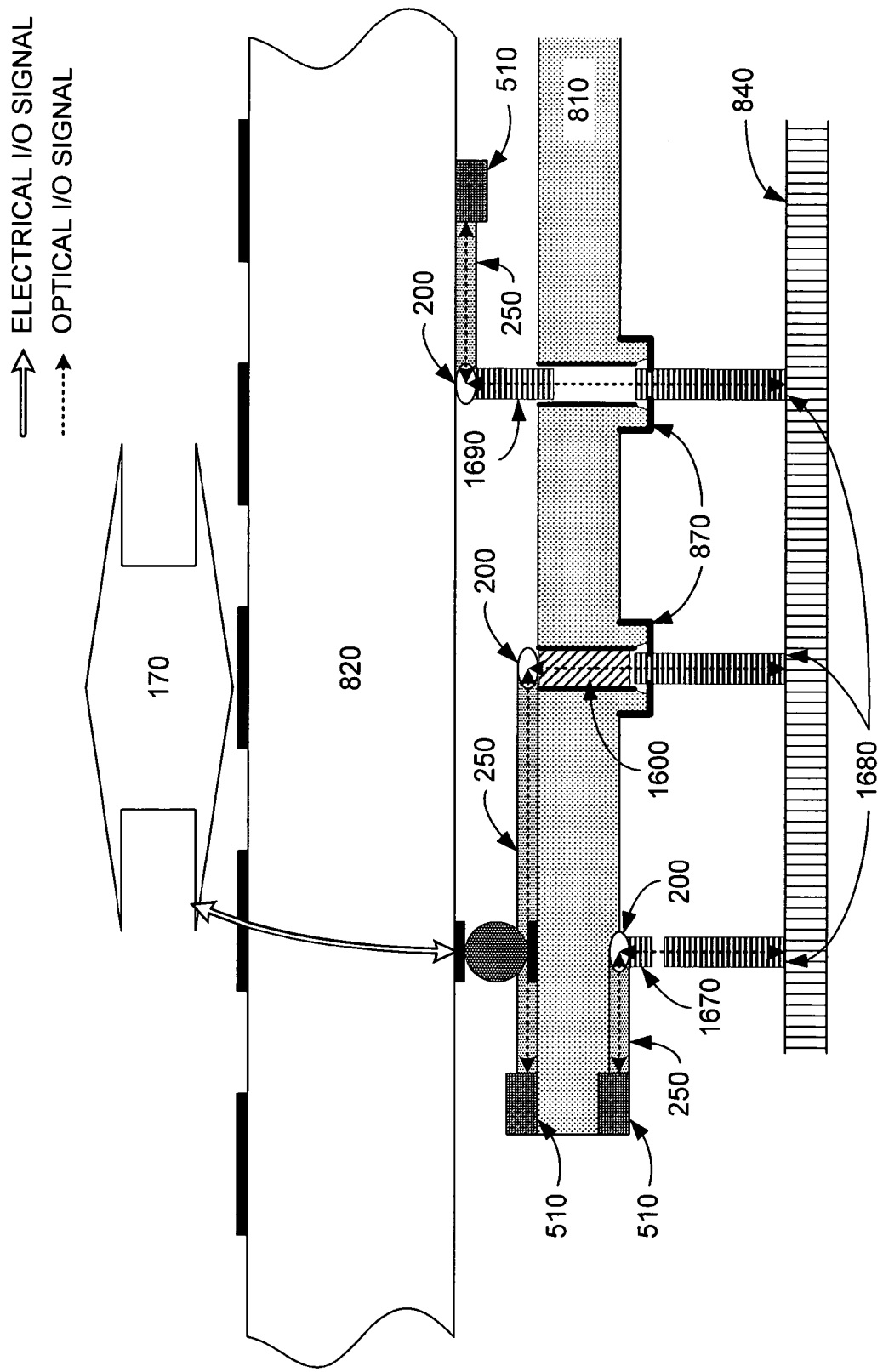
FIG. 16C is a schematic representation of probe module configurations where optical redistribution is performed using polymer pillars.

FIG. 16C illustrates exemplary embodiments of the optical redistribution configurations that are possible using polymer pillars. In the first configuration, redistribution is along the front or probe side of the probe substrate 810, and a polymer pillar probe 1670 is used to butt-couple with a polymer pillar 1680 on the DUT 840. When an optical signal is input into the DUT 840, an optical source 510 located on the probe substrate 810 or on the ATE 130 feeds an optical waveguide 250 where an optical element 200 bends the light in a surface normal direction into the polymer pillar probe 1670 where it is guided into the polymer pillar 1680 on the DUT 840.

An optical signal originating from the DUT 840 would be directed through the polymer pillar probe 1670 to the optical element 200 where it would be captured and directed into the waveguide 250 on the probe substrate 810. The waveguide 250 leads to optical receivers 510 that may redirect the optical signals or convert the optical signals into electrical ones.

In the second configuration, redistribution is along the back side of the probe substrate 810. For an optical signal originating from a DUT 840, light is transmitted from a polymer pillar 1680 to an optical element 200 and a waveguide 250 on the back of the probe substrate 810 to an optical receiver 510. Transmission through the substrate 810 can be accomplished using a probe 870 to align the polymer pillar 1680 and a through-hole filled with an optically transparent material 1600 to guide the light to the optical element 200. Conversely, light from an optical source 510 on the probe substrate 810 entering the waveguide 250 is bent by an optical element 200 and guided by the through-hole to the other side of the substrate 810 where it is captured by a polymer pillar 1680.

In the third configuration, redistribution is along the front of the redistribution substrate 820, and a polymer pillar 1690 is used as a guided wave interconnect between substrates. In this case, the optical probing and redistribution functions are split between the probe and redistribution substrates (810 and 820). An optical signal is transmitted from an optical source 510 through a waveguide 250 to an optical element 200 located along the front of the redistribution substrate 820. The optical element 200 bends the light in a surface normal direction into a polymer pillar 1690. The polymer pillar 1690 directs the signal into a through-hole where it is guided to the other side of the probe substrate 810 and into a polymer pillar 1680 on the DUT 840. Transmission to the optical receiver 510 from the DUT 840 can be accomplished in the opposite direction by guiding a signal into the optical element 200 and the waveguide 250 using the through-hole and the polymer pillar 1690.

Figure 17:
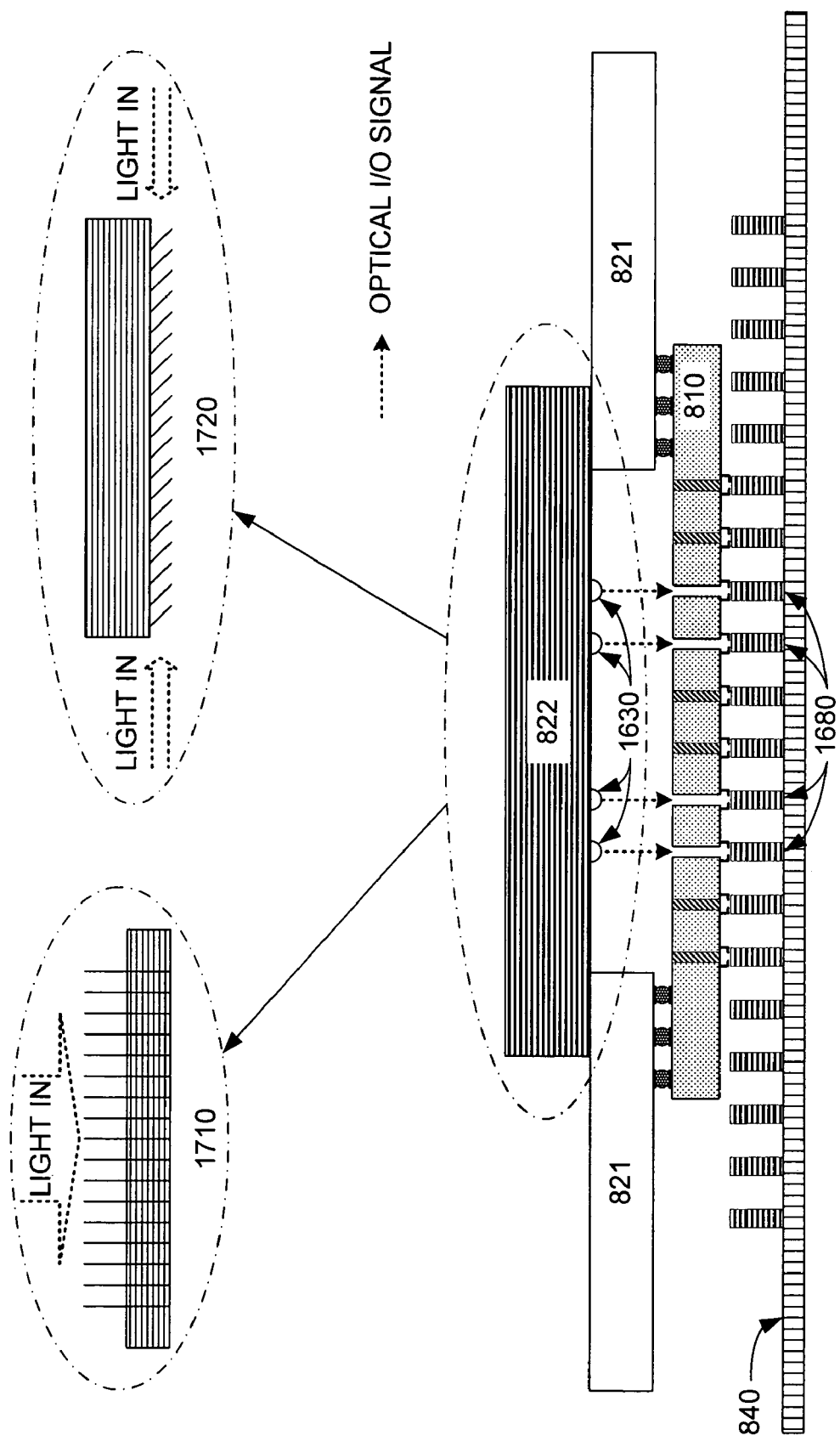
FIG. 17 is a schematic representation of a probe module using microlenses and through-holes for optical signal transmission, including possible light sources for testing.

FIG. 17 illustrates a schematic representation of one possible implementation using separate electrical redistribution substrates 821 and optical redistribution substrate 822. In this non-limiting embodiment, an array of microlenses 1630 is fabricated over an array of vertical cavity surface emitting lasers (VCSELs) and/or photodetectors. The footprint of these devices matches that of the optical through-holes on the probe substrate 810. When the probe module 100 is assembled, the VCSELs and/or photodetectors and the lenses 1630 line up with the through-holes in the probe substrate 810. During testing, light emitting from a VCSEL is focused by a lens 1630 onto a corresponding optical polymer pillar 1680 through the probe substrate 810. Conversely, an optical signal generated by the DUT 840 exits the optical pillar 1680 and is received by a photodetector on the optical redistribution substrate 822. Fabrication of the polymer pillar 1680 with a microlens would allow it to focus the output signal. The light sources 240 can be located on the redistribution substrate 822 or the ATE 130 and can include waveguides 250 for distribution of the signals to the microlenses 1630. Other possible light sources for testing can include, but are not limited to, fiber ribbon 1710 or an array of MEMS mirrors 1720.

Fabrication of a probe module 100 includes fabrication of one or more probe substrates 810 and one or more redistribution substrates 820 designed for routing I/O signals between a specific device under test (DUT) 840 and a piece of automated test equipment (ATE) 130. Fabrication of a probe substrate 810 includes fabrication of probes 870 mounted on the front side of the substrate 810 and one or more distribution networks for routing I/O signals between the probes 870 and the backside of the substrate 810. Fabrication of a redistribution substrate 820 includes fabrication of a distribution network for routing I/O signals between one or more probe substrates 810 and an interface with the ATE 170.

For the purposes of illustration, the following section describes three processing sequences proposed for the fabrication of a probe substrate 810 based on the desired probe design. One skilled in the art would understand how the fabrication processes would proceed based upon FIGS. 18A through 18G, FIGS. 19A through 19G, FIGS. 20A through 20G, and the associated discussion. An exemplary fabrication process is shown in FIGS. 18A through 18G for a probe substrate with straight cantilever 1010 probes. A modification of the exemplary process, as shown in FIGS. 19A through 19G, is used for fabrication of a probe substrate 810 with angled cantilever 1310 probes. Another exemplary process, as shown in FIGS. 20A through 20G, is used to fabricate a probe substrate with shaped cantilever probes.

Figure 18A:
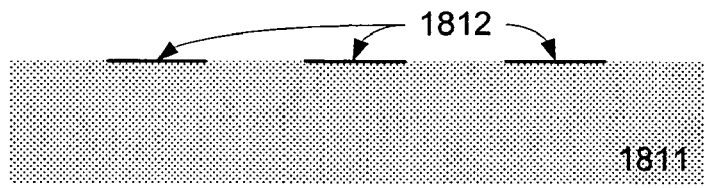
FIGS. 18A through 18G are representations of a fabrication process for probe substrates with straight thin film cantilever arms.

The fabrication process for the probe substrate 810 with straight cantilever arms 1010 begins with a base substrate 1811 as shown schematically in FIG. 18A. For example, a base substrate 1811 can include, but is not limited to, materials such as silicon, silicon compounds, germanium, germanium compounds, gallium, gallium compounds, indium, indium compounds, or other semiconductor materials/compounds. In addition, the base substrate 1811 can include non-semiconductor substrate materials, such as ceramics and organic boards, for example FR-4, alumina, or polyimide. These can be used as rigid support substrates that have thin micromachinable materials attached on top of them. In an exemplary fabrication process, the substrate is silicon (Si).

Before beginning the process, the surface of the base substrate 1811 is cleaned thoroughly. In the first step of the process, the base substrate 1811 is etched using, but not limited to, a Bosch process in a Deep Reactive Ion Etcher (DRIE) or crystal plane-preferential wet etching. Silicon dioxide ($SiO_2$), the native oxide of Si, is highly resistive to this etching process. The etch selectivity of $SiO_2$ to Si in the Bosch process is much greater than 100:1. Therefore, any initial native oxide is removed from the base substrate 1811. This can be achieved by dipping the base substrate 1811 in solutions such as, but not limited to, dilute hydrofluoric (HF) acid or a buffered oxide etch (BOE) solution. After rinsing and drying thoroughly, a first layer of photoresist 1812 is spun on the base substrate 1811 and a pattern is transferred to the substrate 1811 using a first mask. The first mask defines regions where the cantilever probes are formed. The patterned substrate 1811 is then placed in the DRIE and the exposed substrate 1811 is etched to a desired depth.

Figure 18B:
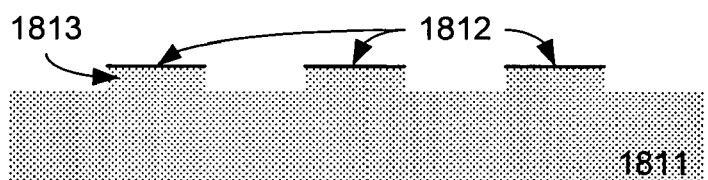

The etching process leaves behind mesa-like structures 1813 on the surface of the base substrate 1811 as shown in FIG. 18B. The depth of the etching, and hence, the height of the Si mesas 1813, is determined based on the desired size and compliance of the probe cantilevers.

Figure 18C:
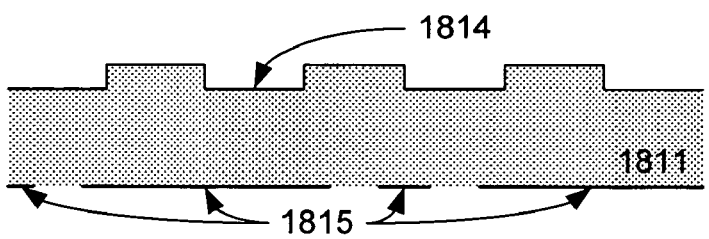

The first layer of photoresist 1812 is then removed and an oxide layer 1814, such as, but not limited to, $SiO_2$, is deposited on the mesa-side of the substrate (FIG. 18C). The oxide 1814 serves as a stop layer for the next step in the fabrication process, which involves etching high aspect ratio vias in the substrate 1811 from the backside. A second layer of photoresist 1815 is spun on to the backside of the wafer and a via pattern is transferred onto it using a second mask.

Figure 18D:
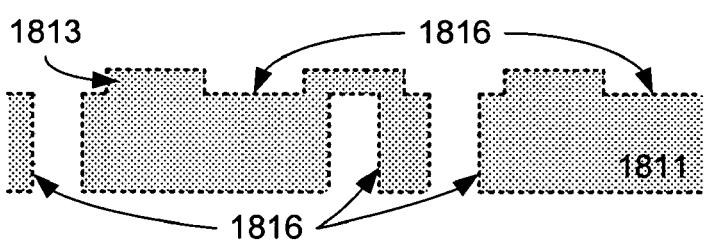

The high aspect-ratio, through-wafer vias are etched, using photoresist 1815 as the etching mask, once again using the Bosch process as shown in FIG. 18D. In this non-limiting example, the vias for optical signal transmission line up directly under the mesas 1813 or vias for electrical signal transmission line up just to the side of the mesas 1813. Vias for electrical signal transmission can also line up in other locations such as directly under the mesas 1813. If optical elements 200 and waveguides 250 are incorporated on the probe substrate 810, then it is possible that optical vias may be located in other positions, or not used in the substrate 810 design. The photoresist 1815 is then removed.

Before the vias are made conductive, an insulation layer 1816 is deposited on the sidewalls and surface of the wafer (FIG. 18D). Examples of suitable insulation materials include, but are not limited to, silicon dioxide and silicon nitride. However, if copper (Cu) is to be used, then it is better to use insulation materials such as silicon nitride to provide a better diffusion barrier. Other good diffusion barriers for Cu include, but are not limited to, tantalum (Ta) and tantalum nitride (TaN).

The probe material has properties such as, but not limited to, elasticity, high conductivity, and non-tarnishment. In addition, the materials should be compatible with standard IC and MEMs fabrication processes. The probe material can include, but is not limited to, soft, springy metals and alloys (e.g., soft gold, nickel, rhodium, beryllium copper, nickel cobalt, palladium cobalt, and paliney (palladium alloys)). These can be deposited by processes such as, but not limited to, sputter deposition, electroless deposition, electroplating, or evaporation. The mechanical performance of the cantilever probes can be further improved by depositing stressed metal films. The stress in the metal films can be engineered to desired levels by varying the methods and/or conditions of deposition.

In another embodiment, two materials can be used where the probes would be formed of a nonconductive material with a low modulus of elasticity (e.g., silicon nitride, silicon dioxide, polyimide, BCB, or other polymers, such as polycarbonates and polynorbonenes) that are metallized with a suitable metal or alloy from the list above. Various combinations of the materials become possible with this approach and can be combined to yield a desired compliance and a low contact resistance.

Figure 18E:
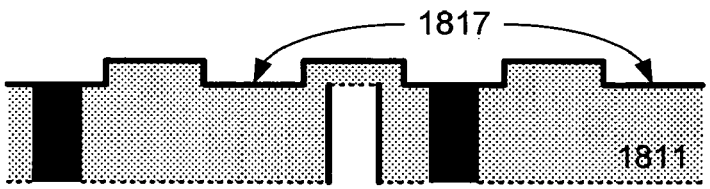

In this exemplary fabrication process, the probes and the through-wafer connections are metallized by a two-step process. First, a thin film of metal 1817 is deposited on the mesa side of the substrate 1811 (FIG. 18E). The thin film 1817 serves as a conductor for the probes. The thin film 1817 also forms the seed layer for the electroplating of metal inside the via. Electroplating fills the vias evenly and yields a low resistance connection. An additional lithography step can be inserted prior to electroplating to block out the vias to be used for through-wafer optical transmission.

Figure 18F:
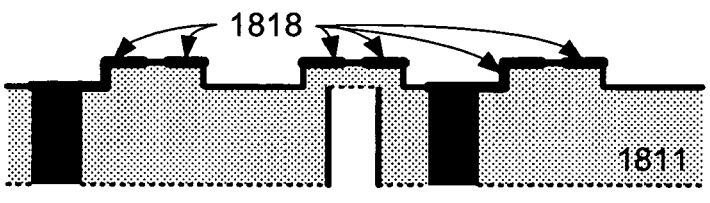
Figure 18G:

A third layer 1818 is used as an etch mask to pattern the metal as illustrated in FIG. 18F. The Si under the probes is etched away, as shown in FIG. 18G, releasing the straight cantilever arms of the probes. The Si can be removed by using wet or dry etching, for example.

A variation of the exemplary fabrication process described can be used for fabrication of a probe substrate 810 with angled cantilever arms 1310. The sequence is shown in FIGS. 19A through 19G using, but not limited to, a Si substrate 1911. In this embodiment, instead of filling the through-wafer connections with a metal, only the sidewalls are metallized.

First, angled trenches 1912 are fabricated in the surface of the substrate 1911 as illustrated in FIG. 19A. This can be achieved using, but not limited to, an anisotropic wet etch process commonly used in MEMS processing utilizing a solution such as, but not limited to, potassium hydroxide (KOH) or tetramethyl ammonium hydroxide (TMAH). A silicon nitride or silicon dioxide film is patterned prior to the wet etch step and serves as an etch mask. The crystal-plane etch selectivity assures that the fabricated trench sidewalls are at the same angle. After the formation of the angled trenches, the etch mask is removed using a suitable wet or dry etch.

The angled sidewalls of the trench form the mold for the cantilever probe. Oxide layers 1913 and 1914 (e.g., $SiO_2$) are deposited by, but not limited to, chemical vapor deposition or thermal oxidation on both sides of the wafer as shown in FIG. 19B. The first oxide layer 1913 on the trench-side of the wafer 1911 provides an etch-stop for the forthcoming Bosch process. The second oxide layer 1914 is deposited on the backside of the substrate 1911, where photolithography and dry etching are used to transfer a via pattern onto the wafer 1911. Dry etching assures that the oxide on the front-side of the wafer is unharmed. This via mask 1914 is aligned to the angled trenches on the front side of the wafer.

Through-substrate vias are etched from the backside of the wafer 1911 in a Si DRIE as shown in FIG. 19C. The process yields highly anisotropic vias in the substrate 1911 and is stopped when the Si under the trenches is etched away. This leaves behind a membrane of oxide 1915 in place of the trenches. The via etching as described above is considered a preprocess etch. That is, the vias are etched prior to fabrication of the actual probe structures.

In this exemplary fabrication process, a two-material process for the probes is described. The probe structures are first patterned on a low modulus core material. The core materials can include, but are not limited to, silicon nitride, silicon dioxide, polyimides or other polymers. This is followed by selective metallization of the structures using processes such as, but not limited to, sputter deposition, electroless plating, or evaporation. Other processes may be used to achieve the same result.

In the current example, the oxide (e.g., $SiO_2$) membrane itself is used for the core material of the probes. If another material is preferred, it can be deposited over the oxide and the oxide etched away through the backside of the wafer. A layer of negative photoresist 1916 is spun on the trench side of the wafer to form a probe mask that is used to pattern the oxide membrane as shown in FIG. 19D.

In FIG. 19E the exposed oxide is etched away using a plasma or other suitable wet process. The photoresist 1916 is removed by rinsing in a solvent (e.g., acetone) or the manufacturer provided resist stripper, which leaves behind the oxide probes. Before the via are made conductive, an insulation layer 1917 is deposited on the sidewalls and surface of the wafer 1911. Examples of suitable insulation materials include, but are not limited to, silicon dioxide and silicon nitride.

A thin, uniform film of metal 1918 is deposited everywhere on the probe substrate, including the via sidewalls, as shown in FIG. 19F, using processes such as, but not limited to, sputter deposition, electroless plating, or evaporation. Optionally, a short electroplating step can be used to increase the metal thickness with care not to cause via blockage. Photolithography and etch sequences are used for removing metal from unwanted areas on the front and back side of the substrate as illustrated in FIG. 19G.

Another variation of an exemplary fabrication process can be used to fabricate a probe substrate 810 with shaped cantilever probes. The sequence is shown in FIGS. 20A through 20G using the same methods in the previous two descriptions. In this embodiment the cantilever arms are shaped to meet specific performance requirements.

Figure 20A:
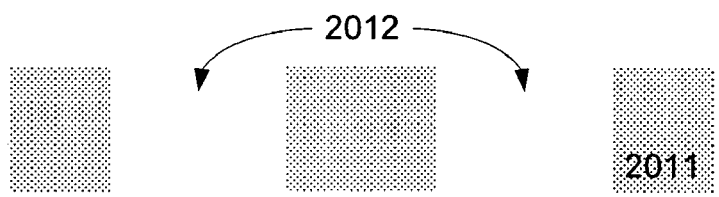
FIGS. 20A through 20G are representations of a fabrication process for probe substrates with shaped cantilever arms.
Figure 20B:
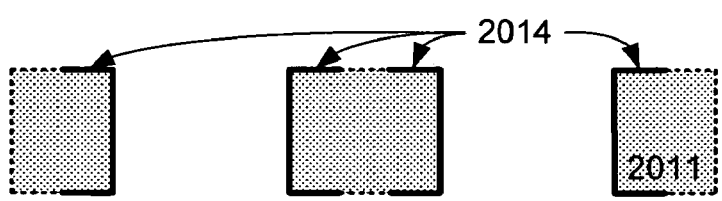
Figure 20C:
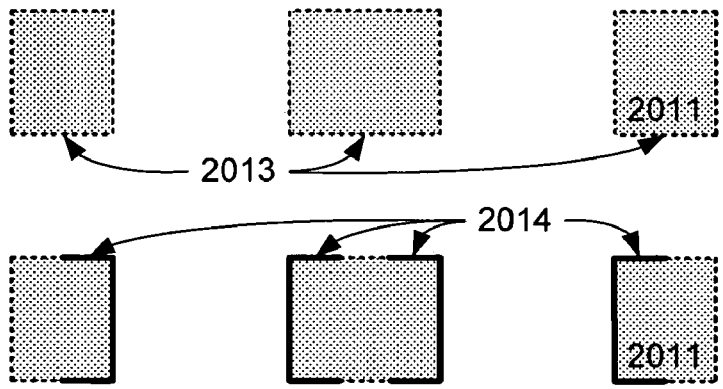

First, the substrate 2011 is cleaned and the through-wafer vias 2012 are etched as illustrated in FIG. 20A using one of the methods previously described. Then, as illustrated in FIG. 20B, an insulation layer 2013 of a material such as, but not limited to, silicon dioxide ($SiO_2$) or silicon nitride ($Si_3N_4$) is deposited on the etched substrate. This is followed by depositing and patterning a conductive layer 2014 of polysilicon/metal as discussed previously (FIG. 20C).

Figure 20D:
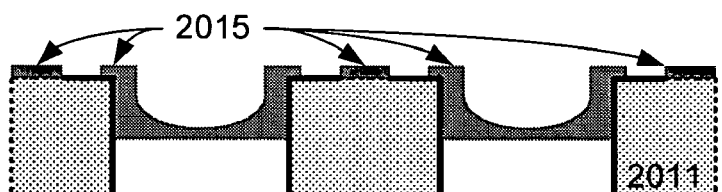
Figure 20E:
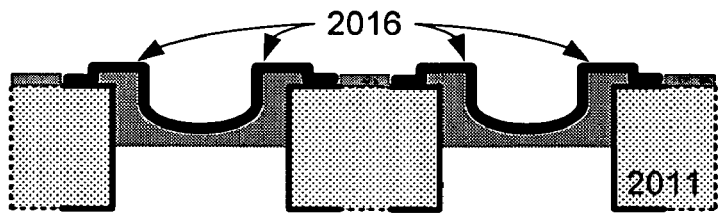
Figure 20F:
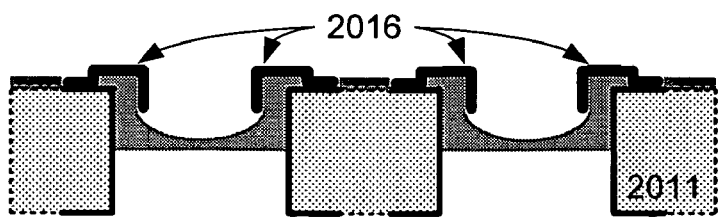
Figure 20G:
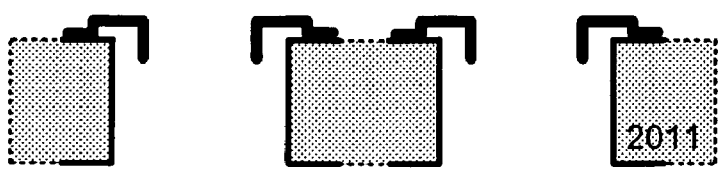

As shown in FIG. 20D, sacrificial material 2015, such as, but not limited to, polycarbonates and polynorbornenes polymers, is then deposited on the substrate 2011 and patterned and etched to produce the desired shape of the cantilever arms. The probe material 2016, such as described previously, is deposited onto the substrate and sacrificial material 2015 (FIG. 20E). The probe material 2016 is then etched to produce the final shapes of the cantilever arms as shown in FIG. 20F. The sacrificial material 2015 is then removed to release the arms as illustrated in FIG. 20G.

A redistribution substrate 820 incorporates electrical and/or optical distribution techniques. Electrical signal distribution networks can be fabricated using various methods such as, but not limited to, traditional multi-level interconnect technology, while optical signal distribution networks can be accomplished by using technology such as, but not limited to, optical dielectric or photonic crystal waveguides. Electrical redistribution can also be implemented using high density printed wiring board (PWB) or other technologies. Any of a number of optical technologies can be utilized in the fabrication process of the optical distribution. One non-limiting example of a possible technology uses board-level waveguides with surface normal coupling. An example would be air-clad waveguides made of suitable polymeric materials having optical elements (diffractive and/or reflective) as described earlier. Optical sources and/or detectors can also be placed directly on the redistribution substrate.

It should be emphasized that the above-described embodiments of the present disclosure are merely possible examples of implementations and are merely set forth for a clear understanding of the principles of the disclosure. Many variations and modifications may be made to the above-described embodiments. For example, a plurality of probe and redistribution substrates can be included in the probe module. Further, optical redistribution can be carried out on either the probe or redistribution substrates or as a combination of distribution networks on both types of substrates. All such modifications and variations are intended to be included herein within the scope of this disclosure and protected by the following claims.

The invention claimed is:

1. A probe module, comprising:
   a redistribution substrate; and
   a probe substrate interfaced with the redistribution substrate, wherein the probe substrate includes at least a first probe element to test an electrical signal and at least a second probe element to test an optical signal of an optoelectronic device under test, wherein the probe elements are configured with cantilever arms, wherein the probe substrate is operative to test at least one signal of at least one optoelectronic device under test.

2. The probe module of claim 1, wherein the probe substrate includes a distribution network including at least one structure for distributing at least one signal, wherein the signal is selected from: an electrical signal, an optical signal, and combinations thereof.

3. The probe module of claim 1, wherein the cantilever arms are angled.

4. The probe module of claim 1, wherein the cantilever arms are made of a non-conductive material.

5. The probe module of claim 1, wherein the cantilever arms are conductive.

6. A probe module, comprising:
a redistribution substrate; and
a probe substrate interfaced with the redistribution substrate, wherein the probe substrate is operative to test at least one signal of at least one optoelectronic device under test, wherein the probe substrate is operative to interface with electrical and optical components, wherein the probe substrate includes at least one probe element and a distribution network including at least one structure for distributing the optical signal, and wherein the probe elements are configured with polymer pillars.

7. The probe module of claim 6, wherein the signal is selected from: an electrical signal, an optical signal, and combinations thereof.

8. The probe module of claim 6, wherein the probe substrate is a replaceable component.

9. The probe module of claim 6, wherein the probe substrate is operative to test the signals of at least two optoelectronic devices under test.

10. The probe module of claim 6, wherein the probe element is configured with cantilever arms.

11. The probe module of claim 10, wherein the cantilever arms are angled.

12. The probe module of claim 10, wherein the cantilever arms are made of a non-conductive material.

13. The probe module of claim 10, wherein the cantilever arms are conductive.

14. The probe module of claim 6, wherein the structure for distribution of an optical signal includes a waveguide.

15. The probe module of claim 6, wherein the structure for distribution of the optical signal is located on the same side of the probe substrate as the probe elements.

16. The probe module of claim 6, wherein the probe substrate is configured to allow optical signals to pass through the substrate.

17. The probe module of claim 16, wherein the probe substrate is configured with at least one through-hole to allow optical signals to pass through the substrate.

18. The probe module of claim 17, wherein the through-hole has a metal lining on the walls of the through-hole.

19. The probe module of claim 17, wherein the through-hole is filled with an optically transparent material.

20. The probe module of claim 16, wherein the structure for distribution of the optical signal is located on the side of the probe substrate opposite the probe elements.

21. The probe module of claim 6, wherein the redistribution substrate includes a distribution network including at least one structure for distributing the optical signal.

22. The probe module of claim 21, wherein the structure for distribution of the optical signal includes a waveguide.

23. The probe module of claim 6, wherein the signal is distributed between the probe substrate and a test equipment interface.

24. The probe module of claim 23, wherein the signal is an optical signal, wherein the optical signal is guided between the probe substrate and the redistribution substrate by at least one polymer pillar.

25. The probe module of claim 23, wherein the signal is an optical signal, wherein the optical signal is guided between the probe substrate and the test equipment interface by an optical fiber.

26. The probe module of claim 23, wherein the signal is an optical signal, wherein the optical signal is guided between the redistribution substrate and the test equipment interface by an optical fiber.

* * * * *